United States Patent
Lin et al.

(10) Patent No.: US 8,927,339 B2
(45) Date of Patent: *Jan. 6, 2015

(54) METHOD OF MAKING THERMALLY ENHANCED SEMICONDUCTOR ASSEMBLY WITH BUMP/BASE/FLANGE HEAT SPREADER AND BUILD-UP CIRCUITRY

(75) Inventors: Charles W. C. Lin, Singapore (SG); Chia-Chung Wang, Judung Jen Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 539 days.

This patent is subject to a terminal disclaimer.

(21) Appl. No.: 13/299,472

(22) Filed: Nov. 18, 2011

(65) Prior Publication Data

US 2012/0129299 A1    May 24, 2012

Related U.S. Application Data

(63) Continuation-in-part of application No. 13/197,163, filed on Aug. 3, 2011, now abandoned.

(60) Provisional application No. 61/415,862, filed on Nov. 22, 2010.

(51) Int. Cl.
| | |
|---|---|
| *H01L 21/60* | (2006.01) |
| *H01L 23/00* | (2006.01) |
| *H01L 21/48* | (2006.01) |
| *H01L 23/13* | (2006.01) |
| *H01L 23/367* | (2006.01) |
| *H01L 23/498* | (2006.01) |
| *H01L 23/538* | (2006.01) |

(52) U.S. Cl.
CPC ............ *H01L 24/19* (2013.01); *H01L 21/4878* (2013.01); *H01L 23/13* (2013.01); *H01L 23/3677* (2013.01); *H01L 23/49816* (2013.01); *H01L 23/5389* (2013.01); *H01L 24/20* (2013.01); *H01L 24/24* (2013.01); *H01L 24/82* (2013.01); *H01L 2224/04105* (2013.01); *H01L 2224/24227* (2013.01); *H01L 2224/73267* (2013.01); *H01L 2224/92244* (2013.01); *H01L 2924/01012* (2013.01); *H01L 2924/01013* (2013.01); *H01L 2924/01029* (2013.01); *H01L 2924/01079* (2013.01); *H01L 2924/01082* (2013.01); *H01L 2924/09701* (2013.01); *H01L 2924/15153* (2013.01); *H01L 2924/1517* (2013.01); *H01L 2924/15321* (2013.01); *H01L 2924/15323* (2013.01); *H01L 2924/01005* (2013.01); *H01L 2924/01006* (2013.01); *H01L 2924/01033* (2013.01); *H01L 2924/0104* (2013.01); *H01L 2924/01047* (2013.01); *H01L 2924/01074* (2013.01); *H01L 2924/01075* (2013.01); *H01L 2924/01087* (2013.01); *H01L 2924/014* (2013.01)
USPC ........................................................ 438/118

(58) Field of Classification Search
CPC . H01L 21/4878; H01L 23/13; H01L 23/3677; H01L 23/49816; H01L 23/5389; H01L 24/19; H01L 24/20; H01L 24/24; H01L 24/82
USPC .................................. 438/118; 257/E21.506
See application file for complete search history.

(56) References Cited

U.S. PATENT DOCUMENTS

| | | |
|---|---|---|
| 3,903,590 A | 9/1975 | Yokogawa |
| 4,246,595 A | 1/1981 | Noyori et al. |

(Continued)

*Primary Examiner* — Walter H Swanson
(74) *Attorney, Agent, or Firm* — Bacon & Thomas, PLLC

(57) ABSTRACT

A method of making a semiconductor assembly that includes a semiconductor device, a heat spreader, an adhesive and a build-up circuitry is disclosed. The heat spreader includes a bump, a base and a flange. The bump defines a cavity. The semiconductor device is mounted on the bump at the cavity, electrically connected to the build-up circuitry and thermally connected to the bump. The bump extends from the base into an opening in the adhesive, the base extends vertically from the bump opposite the cavity and the flange extends laterally from the bump at the cavity entrance. The build-up circuitry includes a dielectric layer and conductive traces on the semiconductor device and the flange. The conductive traces provide signal routing for the semiconductor device.

35 Claims, 8 Drawing Sheets

(56) References Cited

U.S. PATENT DOCUMENTS

| | | | |
|---|---|---|---|
| 5,073,814 A | 12/1991 | Cole, Jr. et al. | |
| 5,111,278 A | 5/1992 | Eichelberger | |
| 5,161,093 A | 11/1992 | Gorczyca et al. | |
| 5,353,498 A | 10/1994 | Fillion et al. | |
| 5,422,513 A | 6/1995 | Marcinkiewicz et al. | |
| 5,432,677 A | 7/1995 | Mowatt et al. | |
| 5,565,706 A | 10/1996 | Miura et al. | |
| 5,583,377 A * | 12/1996 | Higgins, III | 257/707 |
| 5,745,984 A | 5/1998 | Cole, Jr. et al. | |
| 6,154,366 A | 11/2000 | Ma et al. | |
| 6,271,469 B1 | 8/2001 | Ma et al. | |
| 6,555,906 B2 | 4/2003 | Towle et al. | |
| 6,586,822 B1 | 7/2003 | Vu et al. | |
| 6,701,614 B2 | 3/2004 | Ding et al. | |
| 6,713,859 B1 | 3/2004 | Ma | |
| 6,750,397 B2 | 6/2004 | Ou et al. | |
| 7,033,862 B2 | 4/2006 | Chen | |
| 7,129,117 B2 | 10/2006 | Hsu | |
| 7,242,092 B2 | 7/2007 | Hsu | |
| 7,276,800 B2 | 10/2007 | Hsu | |
| 7,312,405 B2 | 12/2007 | Hsu | |
| 7,396,700 B2 | 7/2008 | Hsu | |
| 7,417,299 B2 | 8/2008 | Hu | |
| 7,435,910 B2 | 10/2008 | Sakamoto et al. | |
| 7,449,363 B2 | 11/2008 | Hsu | |
| 7,514,786 B2 | 4/2009 | Hsu | |
| 7,539,022 B2 | 5/2009 | Hsu | |
| 7,554,131 B2 | 6/2009 | Zeng | |
| 7,579,690 B2 | 8/2009 | Chia | |
| 7,582,961 B2 | 9/2009 | Chia et al. | |
| 7,598,610 B2 | 10/2009 | Hsu et al. | |
| 7,619,317 B2 | 11/2009 | Lien et al. | |
| 7,629,204 B2 | 12/2009 | Hsu | |
| 7,705,446 B2 | 4/2010 | Chia et al. | |
| 7,719,104 B2 | 5/2010 | Hsu et al. | |
| 7,763,969 B2 | 7/2010 | Zeng et al. | |
| 7,768,119 B2 | 8/2010 | Chia | |
| 7,829,987 B2 | 11/2010 | Chia | |
| 7,839,649 B2 | 11/2010 | Hsu | |
| 7,852,634 B2 | 12/2010 | Sakamoto et al. | |
| 7,855,342 B2 | 12/2010 | Sakamoto et al. | |
| 7,880,296 B2 | 2/2011 | Wong et al. | |
| 7,888,606 B2 | 2/2011 | Sakamoto et al. | |
| 7,893,360 B2 | 2/2011 | Sakamoto et al. | |
| 7,929,313 B2 | 4/2011 | Ito et al. | |
| 7,957,154 B2 | 6/2011 | Ito et al. | |
| 8,343,808 B2 * | 1/2013 | Lin et al. | 438/118 |
| 2012/0139102 A1 * | 6/2012 | Rahman | 257/737 |

* cited by examiner

METHOD OF MAKING THERMALLY ENHANCED SEMICONDUCTOR ASSEMBLY WITH BUMP/BASE/FLANGE HEAT SPREADER AND BUILD-UP CIRCUITRY

CROSS REFERENCE TO RELATED APPLICATION

This application is a continuation-in-part of U.S. application Ser. No. 13/197,163, entitled "THERMALLY ENHANCED SEMICONDUCTOR ASSEMBLY WITH BUMP/BASE/FLANGE HEAT SPREADER AND BUILD-UP CIRCUITRY" filed Aug. 3, 2011. This application also claims the benefit of filing date of U.S. Provisional Application Ser. No. 61/415,862, entitled "SEMICONDUCTOR CHIP ASSEMBLY WITH BUMP/BASE HEAT SPREADER, CAVITY IN BUMP AND EXTENDED CONDUCTIVE TRACE" filed Nov. 22, 2010 under 35 USC §119 (e) (1).

BACKGROUND OF THE INVENTION

1. Field of the Invention

The present invention relates to a method of making a semiconductor assembly, and more particularly to a method of making a thermally enhanced semiconductor assembly that includes a semiconductor device, a heat spreader, an adhesive and build-up circuitry.

2. Description of Related Art

The convergence of mobility, communication, and computing has created significant thermal, electrical and cost challenges to the semiconductor packaging industry. For instance, semiconductor devices are susceptible to performance degradation as well as short life span and immediate failure at high operating temperatures. Even though chip-level design is continuously reducing the operating bias voltage to get the benefit of reduced power, integrating more functions in a limited space often offsets this potential solution. In addition, semiconductor devices are often susceptible to undesirable electro-magnetic interference (EMI) or other inter-device interference when they are densely packed together. The signal integrity of these devices can be adversely affected when they perform high frequency transmitting or receiving. As such, providing a semiconductor assembly that can provide adequate thermal dissipation, optimize signal integrity, assure high reliability and maintain low cost manufacturing is highly desirable.

Packaging technologies such as plastic ball grid array (PBGA) packages, Quad-Flat No-Lead (QFN) packages, Wafer Level Package (WLP), and Fan-Out Wafer Level Package (FOWLP) have been developed extensively to meet these demands. Plastic ball grid array (PBGA) packages have a chip and an interconnect substrate enclosed in a plastic housing and are attached to a printed circuit board (PCB) by solder balls. The laminated substrate includes a dielectric layer that often includes fiberglass. The heat from the chip flows through the plastic housing and the dielectric layer to the solder balls and then the PCB. Since the plastic housing and the dielectric layer typically have low thermal conductivity, the PBGA provides poor heat dissipation.

Quad-Flat No-Lead (QFN) packages have the chip mounted on a copper die pad which is soldered to the PCB. The heat from the chip flows through the die pad to the PCB. However, since the wire-bonded I/O pads and lead frame type interposer have limited routing capability, the QFN package is not suitable for high performance, high input/output (I/O) devices.

Wafer-level packaging (WLP) or wafer-level chip-scale packaging (WL-CSP) is a packaging technology while semiconductor chips are still in wafer form. As the size of the wafer level package is the same as the chip itself, this packaging format is highly desirable for portable Applications. Wafer level packaging typically features build-up circuitry on the chip surface to transform the peripheral contact pads to wider and larger area-array terminals for assembly consideration. Since the build-up circuitry is formed directly on the chip surface and the fine routing lines allow for greater routing density, the signal integrity can be optimized. However, as the routing circuitry of wafer level packaging is strictly constrained by the silicon area of the semiconductor chip, wafer level packaging is not suitable for most high pin count devices.

U.S. Pat. No. 3,903,590 to Yokogawa discloses an assembly in which semiconductor chips are forcefully embedded in a metal substrate so that a supporting platform can be created. In this approach, a dielectric layer and a conductive trace are overlaid on the embedded chips and the metal substrate for electrically connecting the contact electrodes of the semiconductor chip. The heat flows from the chip through the metal substrate which also provides mechanical support for the fan-out routing circuitry. Although a supporting platform is created and thermal issues can be resolved, applying a pressure of about 370 kg/cm$^2$ at a temperature of 100° C. to 200° C. to press the chip into the metal block is prohibitively cumbersome and prone to damage the chip. Furthermore, since it is difficult to accurately position the chip in the metal substrate due to lateral displacement, and there is no bonding material to secure the embedded chip, voids and inconsistent bond lines arise between the chip and the heat slug. As a result, the assembly suffers from high yield loss, poor reliability and excessive cost.

U.S. Pat. No. 5,111,278 to Eichelberger et al. discloses an assembly in which semiconductor chips are disposed on the planar surface of a substrate. One or more encapsulating/dielectric layers overlay the faces and sides of the chips before fabricating vias and interconnections through the encapsulant to the contact pads to connect these chips. The substrate can include glass, ceramic, plastic, silicon and composites, and the encapsulating layer can include thermoplastic and thermo-set materials. The heat from the chip flows through the encapsulating housing and the substrate to the ambient atmosphere or PCB. Since the plastic housing and the plastic materials typically have low thermal conductivity, this assembly provides poor heat dissipation. Furthermore, as semiconductor chips are placed on a planar surface before lamination, misplacement during die attachment and lamination-induced chip cracking during the build-up process often result in high yield loss.

U.S. Pat. No. 5,353,498 to Fillion et al., U.S. Pat. No. 6,154,366 to Ma et al., and U.S. Pat. No. 6,701,614 to Ding et al. disclose an assembly in which additional area is provided by the encapsulating material which encloses semiconductor chips to be positioned for integrated circuit module fabrication. In this approach, a chip is placed on a supporting film with contact pads facing the supporting film. As such, after molding material is added to the surroundings of the chip, these contact pads are co-planar with the encapsulating material. A dielectric layer having vias can be aligned with the contact pads and an electrical conductor extending through the vias is situated on the substrate. Since the molding material is typically a poor thermal conductor, the heat generated from the enclosed chip is blocked by the molding compound. Even though a mechanical grinding fixture can grind off the backside of the encapsulating material in order to re-expose the chip and therefore lower thermal resistance, the slow grinding process of removing the hardened molding compound can be expensive for high volume manufacture. Furthermore, since the interfacial surfaces between the chips and the encapsulating material would be exposed due to grinding off the backside encapsulating material, moisture penetration, voids and cracks at the interfaces can result in serious reliability concern.

U.S. Pat. No. 5,073,814 to Cole et al., U.S. Pat. No. 5,161,093 to Gorczyca et al., U.S. Pat. No. 5,432,677 to Mowatt et al., and U.S. Pat. No. 5,745,984 to Cole et al. disclose an assembly in which a semiconductor chip is housed in a recess area on the substrate surface before forming circuitry to interconnect the contact pads of the chip. Since the top surface of the chip can be co-planar with the surface of the substrate, lamination-induced displacement or chip cracking can be avoided. However, plastic substrates such as epoxy or polyimide have low thermal conductivity which limit heat dissipation, whereas dielectrics with higher thermal conductivity such as epoxy filled with ceramic or silicon carbide have low adhesion and are prohibitively expensive for high volume manufacture.

U.S. Pat. No. 7,929,313 to Ito et al. discloses a manufacturing method to form a metal layer on the inner wall surface of a cavity so that the embedded semiconductor chip can be protected from electro-magnetic interference. Like other cavity type approaches, this approach suffers poor manufacturing throughput due to inconsistent cavity formation in the resin. Furthermore, since the metal is deposited in the cavity by electro-plating, it has limited thickness and does little to improve the package's thermal performance.

U.S. Pat. No. 6,555,906 to Towel et al, and U.S. Pat. No. 6,750,397 to Ou et al. disclose an assembly in which a semiconductor chip is housed in a cavity of a heat spreader such as a metal block. Since the cavity in the metal block is formed by etching or by micro-machining or by milling out a portion of the material, the major drawbacks include low yield and high cost. Furthermore, inconsistent cavity depth control of the recess in the metal block results in low throughput and low yield in volume production.

In view of the various development stages and limitations in currently available packages for high power and high performance semiconductor devices, there is a need for a semiconductor assembly that is cost effective, reliable, manufacturable, versatile, provides good signal integrity and has excellent heat spreading and dissipation.

SUMMARY OF THE INVENTION

The present invention provides a method for making a semiconductor assembly that includes a semiconductor device, a heat spreader, an adhesive and build-up circuitry. The method for making a semiconductor assembly can include: providing a bump, a flange, an adhesive and a conductive layer with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then attaching the flange and the bump to the conductive layer via the adhesive between the flange and the conductive layer and between the bump and the conductive layer, including aligning the bump with the aperture; then mounting a semiconductor device that includes one or more contact pads on the bump at the cavity; and providing a build-up circuitry and a base, wherein the build-up circuitry extends from the semiconductor device and the flange in the first vertical direction and is electrically connected to the semiconductor device and the base covers the bump in the second vertical direction, is adjacent to the bump and extends laterally from the bump and includes a portion of the conductive layer that is adjacent to the aperture and spaced from the bump.

Attaching the flange and the bump to the conductive layer can include: mounting the adhesive that is non-solidified between the flange and the conductive layer, including aligning the bump with an opening of the adhesive and the aperture of the conductive layer; then flowing the adhesive into a gap located in the aperture between the bump and the conductive layer; and solidifying the adhesive.

Mounting the adhesive between the flange and the conductive layer can include: mounting the adhesive on the flange, including aligning the bump with the opening of the adhesive; and mounting the conductive layer on the adhesive, including aligning the bump with the aperture of the conductive layer.

Mounting the conductive layer on the adhesive can include mounting the conductive layer alone on the adhesive such that the conductive layer contacts the adhesive and the aperture extends through the conductive layer alone. Alternatively, mounting the conductive layer on the adhesive can include mounting a laminated structure that includes the conductive layer and a substrate on the adhesive such that the substrate contacts and is sandwiched between the conductive layer and the adhesive, the conductive layer is spaced from the adhesive and the aperture extends through the conductive layer and the substrate. As another alternative, mounting the conductive layer on the adhesive can include mounting the conductive layer and a carrier on the adhesive such that the conductive layer contacts and is sandwiched between the adhesive and the carrier, and then, after solidifying the adhesive, removing the carrier.

The present invention also provides a method of making a semiconductor assembly that further includes a substrate. The method of making a semiconductor assembly can include: providing a bump, a flange, an adhesive and a substrate with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then attaching the flange and the bump to the substrate via the adhesive between the flange and the substrate and between the bump and the substrate, including aligning the bump with the aperture; then mounting a semiconductor device that includes one or more contact pads on the bump at the cavity; and providing a build-up circuitry and a base, wherein the build-up circuitry extends from the semiconductor device and the flange in the first vertical direction and is electrically connected to semiconductor device and the base covers the bump in the second vertical direction, is adjacent to the bump and extends laterally from the bump.

Attaching the flange and the bump to the substrate can include: mounting the adhesive that is non-solidified between the flange and the substrate, including aligning the bump with an opening of the adhesive and the aperture of the substrate; then flowing the adhesive into a gap located in the aperture between the bump and the substrate; and solidifying the adhesive.

Mounting the adhesive between the flange and the substrate can include: mounting the adhesive on the flange, including aligning the bump with the opening of the adhesive;

and mounting the substrate on the adhesive, including aligning the bump with the aperture of the substrate.

Mounting the substrate on the adhesive can include mounting a laminated structure that includes the substrate and a conductive layer on the adhesive such that the substrate contacts and is sandwiched between the conductive layer and the adhesive, the conductive layer is spaced from the adhesive, the aperture extends through the conductive layer and the substrate and the base includes a portion of the conductive layer.

Flowing the adhesive into the gap can include: applying heat to melt the adhesive; and moving the flange and the substrate (or the conductive layer) towards one another, thereby moving the bump in the second vertical direction in the aperture and applying pressure to the molten adhesive between the flange and the substrate (or the conductive layer), wherein the pressure forces the molten adhesive to flow in the second vertical direction into the gap located in the aperture between the bump and the substrate (or the conductive layer).

Solidifying the adhesive can include applying heat to solidify the molten adhesive, thereby mechanically attaching the bump and the flange to the substrate (or the conductive layer).

The build-up circuitry can include a dielectric layer, one or more via openings and one or more conductive traces. As a result, providing the build-up circuitry can include providing a dielectric layer on the semiconductor device and the flange that extends from the semiconductor device and the flange in the first vertical direction and includes one or more via openings aligned with the contact pad and optionally aligned with the flange; and providing one or more conductive traces on the dielectric layer that extend from the dielectric layer in the first vertical direction and extend laterally on the dielectric layer and extend through the via openings in the second vertical direction to the contact pad and optionally to the flange, thereby electrically connecting the semiconductor device and optionally the flange to the conductive traces.

The build-up circuitry can further include additional layers of dielectric, additional layers of via openings, and additional layers of conductive traces if needed for further signal routing. For instance, the build-up circuitry can further include a second dielectric layer, one or more second via openings and one or more second conductive traces. As a result, providing the build-up circuitry can further include: providing a second dielectric layer on the dielectric layer and the conductive trace that extends from the dielectric layer and the conductive trace in the first vertical direction and includes one or more second via openings aligned with the conductive trace; and providing one or more second conductive traces on the second dielectric layer that extend from the second dielectric layer in the first vertical direction and extend laterally on the second dielectric layer and extend through the second via openings in the second vertical direction to the conductive trace, thereby electrically connecting the conductive trace to the second conductive traces.

The build-up circuitry may extend within and outside the cavity. For instance, the dielectric layer of the build-up circuitry can extend into and fills the remaining space in the cavity. Alternatively, the build-up circuitry can be spaced from and extend outside the cavity. For instance, the cavity may be filled with a die attach so that the dielectric layer does not extend into the cavity and is spaced from the cavity.

In accordance with one aspect of the present invention, the method of making a semiconductor assembly includes: providing a bump, a flange, an adhesive and a conductive layer, wherein (i) the bump defines a cavity that faces in a first vertical direction, covers the cavity in a second vertical direction opposite the first vertical direction, is adjacent to and integral with the flange, extends vertically from the flange in the second vertical direction, extends into an opening in the adhesive and is aligned with a aperture in the conductive layer, (ii) the flange extends laterally from the bump in lateral directions orthogonal to the vertical directions, (iii) the adhesive is sandwiched between the flange and the conductive layer and is non-solidified, and (iv) the conductive layer is mounted on the adhesive; then flowing the adhesive into a gap located in the aperture between the bump and the conductive layer; solidifying the adhesive; then mounting a semiconductor device that includes one or more contact pads on the bump, thereby mechanically attaching and thermally connecting the semiconductor device to the bump, wherein the semiconductor device extends into the cavity; providing a dielectric layer on the semiconductor device and the flange that extends from the semiconductor device and the flange in the first vertical direction and includes one or more via openings that are aligned with and expose the contact pads and optionally the flange; providing one or more conductive traces on the dielectric layer that extend from the dielectric layer in the first vertical direction and extend laterally on the dielectric layer and extend through the via openings in the second vertical direction to the contact pads and optionally to the flange, thereby electrically connecting the semiconductor device and optionally the flange to the conductive traces; providing a base that is adjacent to the bump, extends from and covers the bump in the second vertical direction, extends laterally from the bump and includes a portion of the conductive layer that is adjacent to the aperture and spaced from the bump; and providing a heat spreader that includes the bump, the base and the flange, wherein the semiconductor device is thermally connected to the base by the bump.

In accordance with another aspect of the present invention, the method of making a semiconductor assembly includes: providing a bump and a flange, wherein the bump defines a cavity that faces in a first vertical direction, is adjacent to and integral with the flange and extends vertically from the flange in a second vertical direction opposite the first vertical direction, the flange extends laterally from the bump in lateral directions orthogonal to the vertical directions and the cavity is covered by the bump in the second vertical direction; providing an adhesive, wherein an opening extends through the adhesive; providing a conductive layer, wherein an aperture extends through the conductive layer; mounting the adhesive on the flange, including inserting the bump into the opening; mounting the conductive layer on the adhesive, including aligning the bump with the aperture, wherein the adhesive is sandwiched between the flange and the conductive layer and is non-solidified; then applying heat to melt the adhesive; moving the flange and the conductive layer towards one another, thereby moving the bump in the second vertical direction in the aperture and applying pressure to the molten adhesive between the flange and the conductive layer, wherein the pressure forces the molten adhesive to flow in the second vertical direction into a gap located in the aperture between the bump and the conductive layer; applying heat to solidify the molten adhesive, thereby mechanically attaching the bump and the flange to the conductive layer; then mounting a semiconductor device that includes one or more contact pads on the bump, thereby mechanically attaching and thermally connecting the semiconductor device to the bump, wherein the semiconductor device extends into the cavity; then providing a dielectric layer on the semiconductor device and the flange that extends from the semiconductor device and the flange in the first vertical direction and includes one or more via openings that are aligned with and expose the contact pads and optionally the flange; then providing one or more conductive traces on the dielectric layer that extend from the dielectric layer in the first vertical direction and extend laterally on the dielectric layer and extend through the via openings in the second vertical direction to the contact pads and optionally to the flange, thereby electrically connecting the semiconductor device and optionally the flange to the conductive traces; providing a base that is adjacent to the bump, extends from and covers the bump in the second vertical direction, extends laterally from the bump and includes a portion of the conductive layer that is adjacent to the aperture and spaced from the bump; and providing a heat spreader that includes the bump, the base and the flange, wherein the semiconductor device is thermally connected to the base by the bump.

In accordance with yet another aspect of the present invention, the method of making a semiconductor assembly includes: providing a bump, a flange, an adhesive and a laminated structure that includes a conductive layer and a substrate, wherein (i) the bump defines a cavity that faces in a first vertical direction, covers the cavity in a second vertical direction opposite the first vertical direction, is adjacent to and integral with the flange, extends vertically from the flange in the second vertical direction, extends into an opening in the adhesive and is aligned with a aperture in the laminated structure, (ii) the flange extends laterally from the bump in lateral directions orthogonal to the vertical directions, (iii) the adhesive is sandwiched between the flange and the laminated structure and is non-solidified, and (iv) the laminated structure is mounted on the adhesive such that the substrate is sandwiched between the adhesive and the conductive layer; then flowing the adhesive into a gap located in the aperture between the bump and the laminated structure; solidifying the adhesive; then mounting a semiconductor device that includes one or more contact pads on the bump, thereby mechanically attaching and thermally connecting the semiconductor device to the bump, wherein the semiconductor device extends into the cavity; providing a dielectric layer on the semiconductor device and the flange that extends from the semiconductor device and the flange in the first vertical direction and includes one or more via openings that are aligned with and expose the contact pads and optionally the flange; providing one or more conductive traces on the dielectric layer that extend from the dielectric layer in the first vertical direction and extend laterally on the dielectric layer and extend through the via openings in the second vertical direction to the contact pads and optionally to the flange, thereby electrically connecting the semiconductor device and optionally the flange to the conductive traces; providing a base that is adjacent to the bump, extends from and covers the bump in the second vertical direction, extends laterally from the bump and includes a portion of the conductive layer that is adjacent to the aperture and spaced from the bump; and providing a heat spreader that includes the bump, the base and the flange, wherein the semiconductor device is thermally connected to the base by the bump.

In accordance with still another aspect of the present invention, the method of making a semiconductor assembly includes: providing a bump and a flange, wherein the bump defines a cavity that faces in a first vertical direction, is adjacent to and integral with the flange and extends vertically from the flange in a second vertical direction opposite the first vertical direction, the flange extends laterally from the bump in lateral directions orthogonal to the vertical directions and the cavity is covered by the bump in the second vertical direction; providing an adhesive, wherein an opening extends through the adhesive; providing a laminated structure that includes a conductive layer and a substrate, wherein an aperture extends through the conductive layer and the substrate; mounting the adhesive on the flange, including inserting the bump into the opening; mounting the laminated structure on the adhesive, including aligning the bump with the aperture, wherein the adhesive is sandwiched between the flange and the laminated structure and is non-solidified and the substrate is sandwiched between the adhesive and the conductive layer; then applying heat to melt the adhesive; moving the flange and the laminated structure towards one another, thereby moving the bump in the second vertical direction in the aperture and applying pressure to the molten adhesive between the flange and the laminated structure, wherein the pressure forces the molten adhesive to flow in the second vertical direction into a gap located in the aperture between the bump and the laminated structure; applying heat to solidify the molten adhesive, thereby mechanically attaching the bump and the flange to the conductive layer and the substrate; then mounting a semiconductor device that includes one or more contact pads on the bump, thereby mechanically attaching and thermally connecting the semiconductor device to the bump, wherein the semiconductor device extends into the cavity; then providing a dielectric layer on the semiconductor device and the flange that extends from the semiconductor device and the flange in the first vertical direction and includes one or more via openings that are aligned with and expose the contact pads and optionally the flange; then providing one or more conductive traces on the dielectric layer that extend from the dielectric layer in the first vertical direction and extend laterally on the dielectric layer and extend through the via openings in the second vertical direction to the contact pads and optionally to the flange, thereby electrically connecting the semiconductor device and optionally the flange to the conductive traces; providing a base that is adjacent to the bump, extends from and covers the bump in the second vertical direction, extends laterally from the bump and includes a portion of the conductive layer that is adjacent to the aperture and spaced from the bump; and providing a heat spreader that includes the bump, the base and the flange, wherein the semiconductor device is thermally connected to the base by the bump.

Mounting the semiconductor device can include mechanically attaching and thermally connecting the semiconductor device to the bump using a die attach that is located within the cavity.

Providing the conductive trace can include depositing a plated layer on the dielectric layer that extends through the via opening to the contact pad and optionally to the flange, and then removing selected portions of the plated layer using an etch mask that defines the conductive trace.

Providing the base can include grinding the bump, the adhesive and the conductive layer such that the bump, the adhesive and the conductive layer are laterally aligned with one another at a lateral surface that faces in the second vertical direction; and then depositing a plated layer on the bump, the adhesive and the conductive layer, wherein the plated layer covers the bump in the second vertical direction and extends laterally from the bump to the conductive layer. The grinding can include grinding the adhesive without grinding the bump and then grinding the bump, the adhesive and the conductive layer.

Providing the conductive trace and the base can include simultaneously depositing a first plated layer on the dielectric layer and a second plated layer on the bump, the adhesive and the conductive layer.

Providing the dielectric layer, the conductive trace and the base can include grinding the bump, the adhesive and the conductive layer such that the bump, the adhesive and the conductive layer are laterally aligned with one another at a lateral surface that faces in the second vertical direction; then depositing the dielectric layer on the semiconductor device and the flange; then forming the via opening in the dielectric layer; then depositing a first plated layer on the dielectric layer, wherein the first plated layer extends through the via opening to the contact pad and optionally to the flange; depositing a second plated layer on the bump, the adhesive and the conductive layer, wherein the second plated layer covers the bump in the second vertical direction; then forming an etch mask on the first plated layer that defines the conductive trace; etching the first plated layer in a pattern defined by the etch mask; and then removing the etch mask.

In a preferred embodiment, the method of making a semiconductor assembly includes: providing a bump and a flange, wherein the bump defines a cavity that faces in a first vertical direction, is adjacent to and integral with the flange and extends vertically from the flange in a second vertical direction opposite the first vertical direction, the flange extends laterally from the bump in lateral directions orthogonal to the vertical directions and the cavity is covered by the bump in the second vertical direction; providing an adhesive, wherein an opening extends through the adhesive; providing a laminated structure that includes a conductive layer and a substrate, wherein an aperture extends through the laminated structure; mounting the adhesive on the flange, including inserting the bump into the opening; mounting the laminated structure on the adhesive, including inserting the bump into the aperture, wherein the substrate contacts and is sandwiched between the conductive layer and the adhesive, the conductive layer is spaced from the adhesive and the adhesive contacts and is sandwiched between the flange and the substrate and is non-solidified; then applying heat to melt the adhesive; moving the flange and the laminated structure towards one another, thereby moving the bump in the second vertical direction in the aperture and applying pressure to the molten adhesive between the flange and the laminated structure, wherein the pressure forces the molten adhesive to flow in the second vertical direction into a gap located in the aperture between the bump and the laminated structure; applying heat to solidify the molten adhesive, thereby mechanically attaching the bump and the flange to the conductive layer and the substrate; then grinding the bump, the adhesive and the conductive layer such that the bump, the adhesive and the conductive layer are laterally aligned with one another at a lateral surface that faces in the second vertical direction; then mounting a semiconductor device that includes one or more contact pads on the bump using a die attach, thereby mechanically attaching and thermally connecting the semiconductor device to the bump, wherein the semiconductor device extends into the cavity and the bump provides a recessed die paddle for the semiconductor device; then depositing a dielectric layer on the semiconductor device and the flange that extends from the semiconductor device and the flange in the first vertical direction and extends into and fills the remaining space in the cavity; then forming one or more via openings that extend through the dielectric layer and are aligned with and expose the contact pads and optionally the flange; then depositing a first plated layer on the dielectric layer and removing selected portions of the first plated layer in a pattern defined by an etch mask, wherein one or more conductive traces include a selected portion of the first plated layer that extends from the dielectric layer in the first vertical direction and extends laterally on the dielectric layer and extends through the via openings in the second vertical direction to the contact pads and optionally to the flange, thereby electrically connecting the semiconductor device and optionally the flange to the conductive traces; depositing a second plated layer on the bump, the adhesive and the conductive layer, wherein a base is adjacent to the bump, extends from and covers the bump in the second vertical direction, extends laterally from the bump, includes a portion of the conductive layer that is adjacent to the substrate and spaced from the bump and includes a portion of the second plated layer that is adjacent to the bump, the adhesive and the conductive layer and covers the bump in the second vertical direction; and providing a heat spreader that includes the bump, the base and the flange, wherein the semiconductor device is thermally connected to the base by the bump.

In accordance with the above-mentioned preferred embodiment, the method can further include: depositing a second dielectric layer on the dielectric layer and the conductive traces that extends from the dielectric layer and the conductive traces in the first vertical direction and is spaced from the semiconductor device, the flange and the cavity; then forming one or more second via openings that extend through the second dielectric layer and are aligned with and expose the conductive traces; and then forming one or more second conductive traces that extend from the second dielectric layer in the first vertical direction and extend laterally on the second dielectric layer and extend through the second via openings in the second vertical direction to the conductive traces, thereby electrically connecting the conductive traces to the second conductive traces.

Providing the bump can include mechanically stamping a metal plate, thereby forming the bump in the metal plate and the cavity in the bump, wherein the bump is a stamped portion of the metal plate and the flange is an unstamped portion of the metal plate. The metal plate can be made of copper, aluminum, nickel, iron or their alloys.

Providing the adhesive can include providing a prepreg with uncured epoxy. Flowing the adhesive can include melting the uncured epoxy and compressing the uncured epoxy between the flange and the conductive layer or between the flange and the substrate. Solidifying the adhesive can include curing the uncured epoxy.

Flowing the adhesive can include filling the gap with the adhesive and forcing the adhesive beyond the bump and the conductive layer in the second vertical direction such that the adhesive contacts surfaces of the bump and the conductive layer that face in the second vertical direction.

Providing the dielectric layer can include depositing the dielectric layer on and in contact with the semiconductor device, the bump and the flange and spaced from the adhesive by the flange. Alternatively, the method of making a semiconductor assembly can further include removing a selected portion of the flange that is spaced from the bump after solidifying the adhesive and before mounting the semiconductor device, and providing the dielectric layer can include depositing the dielectric layer on and in contact with the semiconductor device, the bump, the flange and the adhesive and spaced from the substrate (or the conductive layer) by the adhesive.

Depositing the first plated layer and the second plated layer can include simultaneously depositing the first and second plated layers using electroless plating and electrolytic plating.

The dielectric layers can be deposited and extend to peripheral edges of the assembly by numerous techniques including film lamination, roll coating, spin coating and spray-on deposition. The via openings can be formed through the dielectric layers by numerous techniques including laser drilling, plasma etching and photolithography. The plated layers can be deposited by numerous techniques including electro-plating, electroless plating, evaporating, sputtering, and their combinations as a single layer or multiple layers. The plated layers can be patterned by numerous techniques including wet etching, electro-chemical etching, laser-assist etching, and their combinations to define the conductive traces.

By the above-mentioned method, the heat spreader of the thermally enhanced semiconductor assembly can include a bump, a base and a flange, wherein (i) the bump is adjacent to the base and the flange, is integral with the flange, extends from the base in a first vertical direction and extends from the flange in a second vertical direction opposite the first vertical direction, (ii) the base extends from the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump and has an entrance at the flange.

The heat spreader can be made of any material with thermal conductivity. Preferably, the heat spreader is made of metal. For instance, the heat spreader can consist essentially of copper, aluminum, nickel, iron, or their alloys. In any case, the heat spreader can provide heat dissipation and spreading from the semiconductor device to the next level assembly.

The adhesive between the flange and the substrate (or the conductive layer) can flow into a gap located in the aperture between the bump and the substrate (or the conductive layer), as above mentioned. Accordingly, the adhesive can have a first thickness (in the vertical directions) where it is adjacent to the flange and a second thickness (in the lateral directions) where it is adjacent to the bump that is different from the first thickness.

The semiconductor device can be a packaged or unpackaged semiconductor chip. For instance, the semiconductor device can be a land grid array (LGA) package or wafer level package (WLP) that includes a semiconductor chip. Alternatively, the semiconductor device can be a semiconductor chip.

The substrate can extend to peripheral edges of the assembly and be made of organic materials such as epoxy, glass-epoxy, and polyimide. The substrate can also be made of thermally conductive materials such as aluminum oxide ($Al_2O_3$), aluminum nitride (AlN), silicon nitride (SiN), silicon (Si) etc. Alternatively, the substrate can be a single layer structure or a multi-layer structure such as a laminated circuit board or a multi-layer ceramic board. Furthermore, the substrate can be laminated to a conductive layer and the aperture can extend through the substrate and the conductive layer.

The bump can be integral with the flange. For instance, the bump and the flange can be a single-piece metal or include a single-piece metal at their interface, and the single-piece metal can be copper. The bump can also be coplanar with the adhesive at the base. The bump can include a first bent corner adjacent to the base and a second bent corner adjacent to the flange. The bump can also have an irregular thickness characteristic of stamping. The bump can also have a larger diameter or dimension at the flange than at the base. For instance, the bump can have a cut-off conical or pyramidal shape in which its diameter or dimension increases as it extends in the first vertical direction from the base to the flange. Accordingly, as the adhesive extends into the gap between the bump and the substrate or between the bump and the base in the second vertical direction, the adhesive can have an increasing thickness where it is adjacent to the bump. The bump can also have a cylindrical shape with a constant diameter. Accordingly, the adhesive can have a constant thickness in the gap between the bump and the substrate or between the bump and the base. The bump can also provide a recessed die paddle for the semiconductor device.

The cavity in the bump can have a larger diameter or dimension at its entrance than at its floor. For instance, the cavity can have a cut-off conical or pyramidal shape in which its diameter or dimension increases as it extends in the first vertical direction from its floor to its entrance. Alternatively, the cavity can have a cylindrical shape with a constant diameter. The cavity can also have a circular, square or rectangular periphery at its entrance and its floor. The cavity can also conform to the shape of the bump, extend into the opening and the aperture and extend across most of the bump in the vertical and lateral directions.

The base can include a portion of the conductive layer that is spaced from the bump and can include a portion of the plated layer. As a result, the base can have a first thickness where it is adjacent to the bump, a second thickness where it is adjacent to the substrate, and a flat surface that faces in the second vertical direction. The base can also have the first thickness where it is adjacent to the adhesive and spaced from the substrate and the second thickness where it is adjacent to a corner-shaped interface between the adhesive and the substrate. The base can also contact the adhesive and the substrate, cover the flange in the second vertical direction, extend laterally beyond the flange, support the adhesive and extend to peripheral edges of the assembly. The base can also have a surface area in a lateral plane that is larger than that of the bump and the flange combined.

The flange can be sandwiched between the build-up circuitry and the adhesive. The flange can also have a circular, square or rectangular periphery. In addition, the flange may be spaced from or extend to peripheral edges of the assembly.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

The present invention has numerous advantages. The heat spreader can provide excellent heat spreading and heat dissipation without heat flow through the adhesive. As a result, the adhesive and the substrate can be a low cost dielectric and not prone to delamination. The bump and the flange can be integral with one another, thereby providing excellent electromagnetic shielding and a moisture barrier for the semiconductor device, thereby enhancing electrical performance and environmental reliability. The mechanically-formed cavity in the bump can provide a well-defined space for semiconductor device placement. As a result, the semiconductor device shifting and cracking during lamination can be avoided, thereby enhancing manufacturing yield and reducing cost. The base can include a selected portion of the metal layer associated with the substrate, thereby enhancing thermal performance. The base can provide mechanical support for the substrate, thereby preventing warping. The adhesive can be sandwiched between the bump and the substrate, between the base and the substrate and between the flange and the substrate, thereby providing a robust mechanical bond between the heat spreader and the substrate. The build-up circuitry can provide electrical connections to the semiconductor device with plated metal without wire bonds or solder joints, thereby increasing reliability. The build-up circuitry can also provide signal routing with simple circuitry patterns or flexible multi-layer signal routing with complex circuitry patterns.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Embodiment 1

Figure 1A:
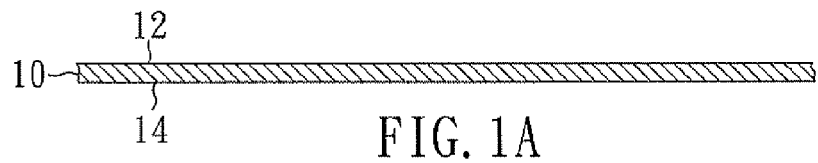
FIGS. 1A and 1B are cross-sectional views showing a bump and a flange in accordance with an embodiment of the present invention.
Figure 1B:
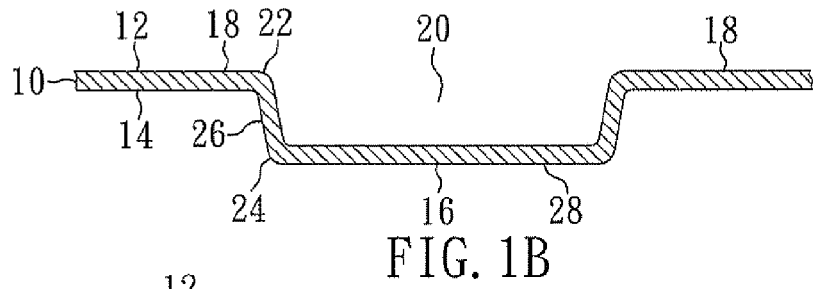
Figure 1C:
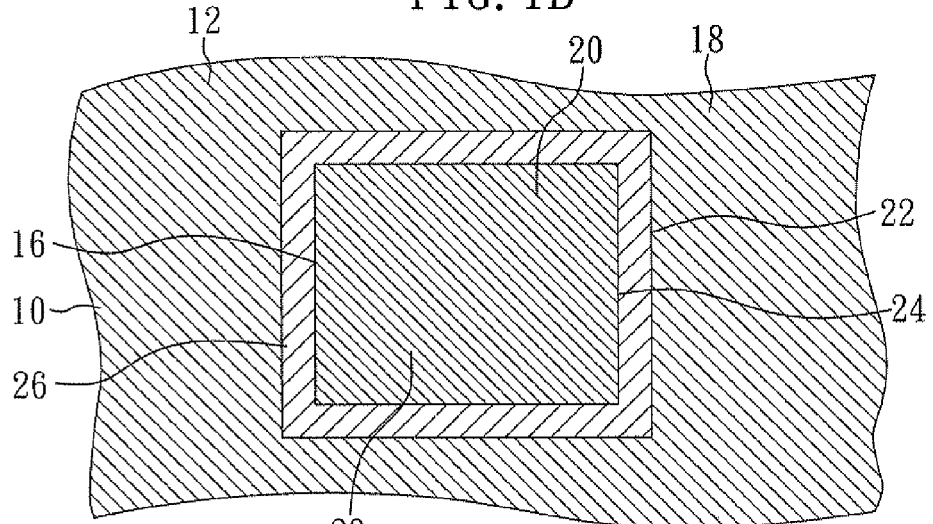
FIGS. 1C and 1D are top and bottom views, respectively, corresponding to FIG. 1B.
Figure 1D:
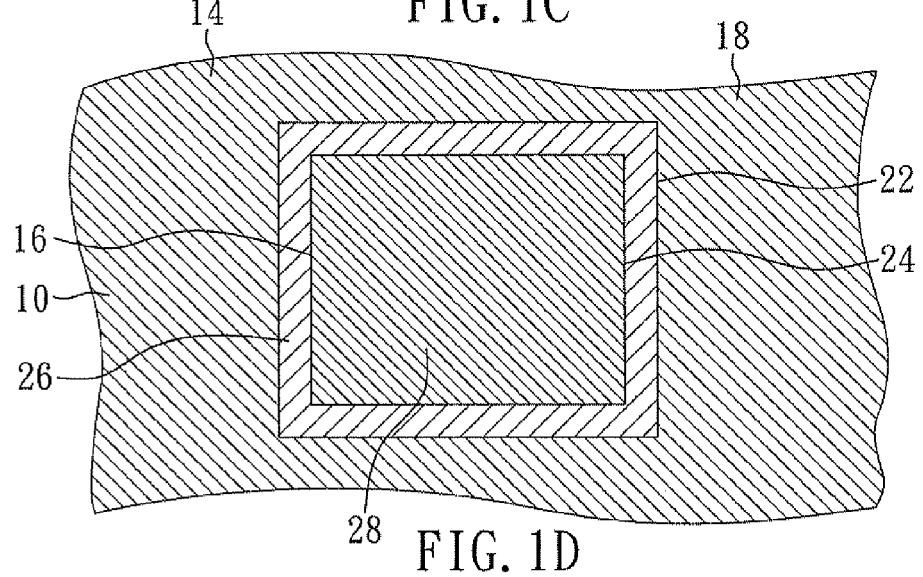

FIGS. 1A and 1B are cross-sectional views showing a method of making a bump and a flange in accordance with an embodiment of the present invention, and FIGS. 1C and 1D are top and bottom views, respectively, corresponding to FIG. 1B.

FIG. 1A is a cross-sectional view of metal plate 10 which includes opposing major surfaces 12 and 14. Metal plate 10 is illustrated as a copper plate with a thickness of 100 microns. Copper has high thermal conductivity, good flexibility and low cost. Metal plate 10 can be various metals such as copper, aluminum, alloy 42, iron, nickel, silver, gold, combinations thereof, and alloys thereof.

FIGS. 1B, 1C and 1D are cross-sectional, top and bottom views, respectively, of metal plate 10 with bump 16, flange 18 and cavity 20. Bump 16 and cavity 20 are formed by mechanically stamping metal plate 10. Thus, bump 16 is a stamped portion of metal plate 10 and flange 18 is an unstamped portion of metal plate 10.

Bump 16 is adjacent to and integral with flange 18 and extends from flange 18 in the downward direction. Bump 16 includes bent corners 22 and 24, tapered sidewall 26 and floor 28. Bent corners 22 and 24 are bent by the stamping operation. Bent corner 22 is adjacent to flange 18 and tapered sidewall 26 and bent corner 24 is adjacent to tapered sidewall 26 and floor 28. Tapered sidewall 26 extends outwardly as it extends in the upward direction and floor 28 extends laterally in lateral directions (such as left and right) orthogonal to the upward and downward directions. Thus, bump 16 has a cut-off pyramidal shape (resembling a frustum) in which its diameter decreases as it extends downwardly from flange 18 to floor 28 and increases as it extends upwardly from floor 28 to flange 18. Bump 16 has a height of 300 microns relative to flange 18, a dimension of 10.5 mm by 8.5 mm at flange 18 and a dimension of 10.25 mm by 8.25 mm at floor 28. Furthermore, bump 16 has an irregular thickness due to the stamping operation. For instance, tapered sidewall 26 is thinner than floor 28 since it is elongated by the stamping operation. Bump 16 is shown with a uniform thickness for convenience of illustration.

Flange 18 extends laterally from bump 16 in the lateral directions, is flat and has a thickness of 100 microns.

Cavity 20 faces in the upward direction, extends into bump 16, is covered by bump 16 in the downward direction and has an entrance at flange 18. Cavity 20 also conforms to the shape of bump 16. Thus, cavity 20 has a cut-off pyramidal shape (resembling a frustum) in which its diameter decreases as it extends downwardly from its entrance at flange 18 to floor 28 and increases as it extends upwardly from floor 28 to its entrance at flange 18. Furthermore, cavity 20 extends across most of bump 16 in the vertical and lateral directions and has a depth of 300 microns.

Figure 2A:
FIGS. 2A and 2B are cross-sectional views showing an adhesive in accordance with an embodiment of the present invention.
Figure 2B:
Figure 2C:
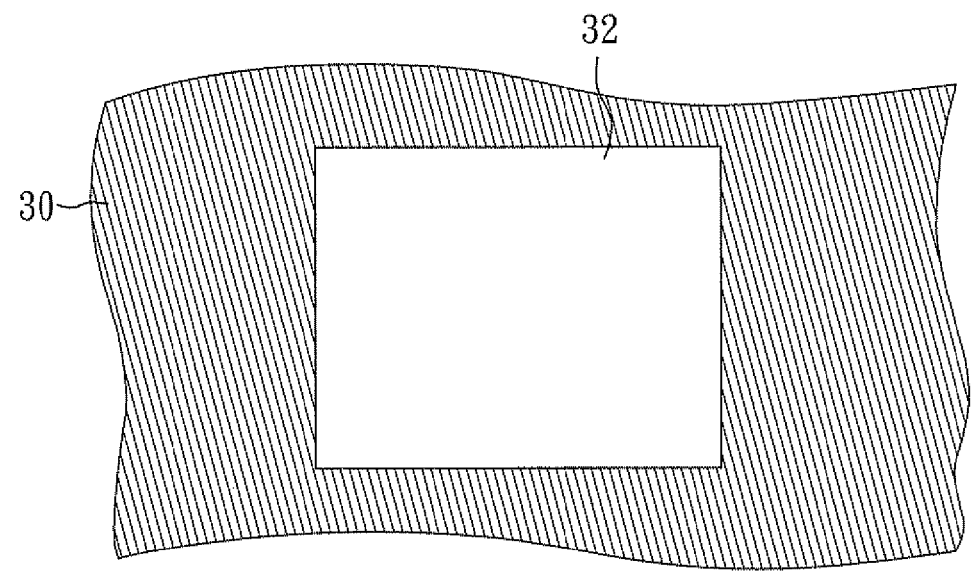
FIGS. 2C and 2D are top and bottom views, respectively, corresponding to FIG. 2B.
Figure 2D:
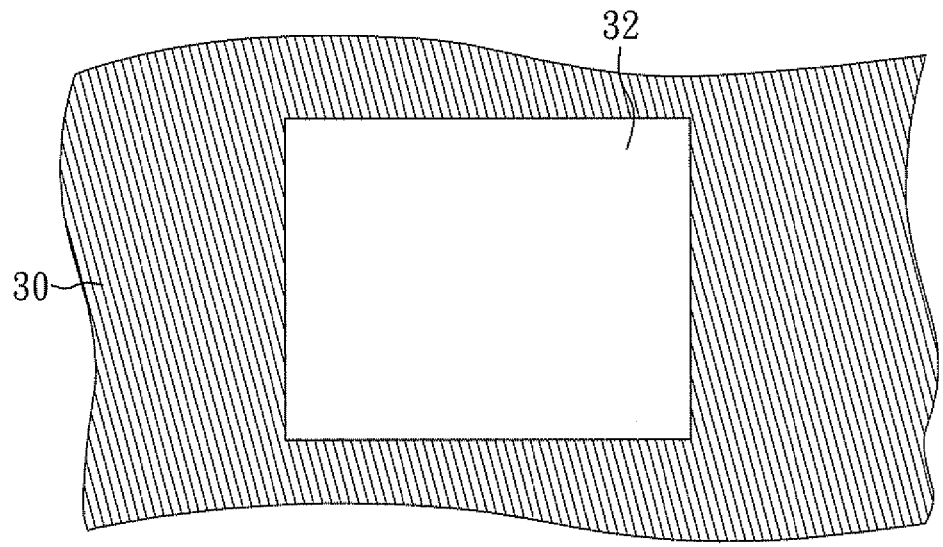

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified unpatterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific Applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and they mal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a dimension of 10.55 mm by 8.55 mm. Opening 32 is formed by punching through the prepreg and can be formed by other techniques such as laser cutting.

Figure 3A:
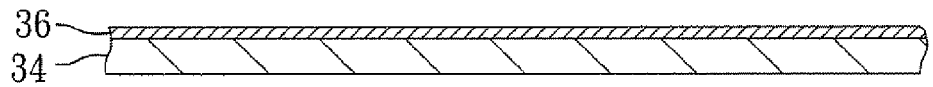
FIGS. 3A and 3B are cross-sectional views showing a laminated structure including a substrate and a conductive layer in accordance with an embodiment of the present invention.
Figure 3B:
Figure 3C:
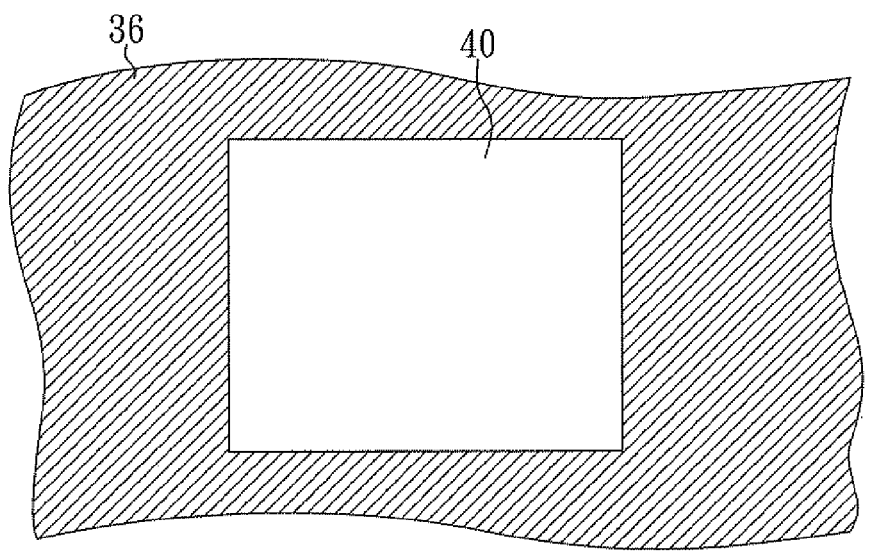
FIGS. 3C and 3D are top and bottom views, respectively, corresponding to FIG. 3B.
Figure 3D:
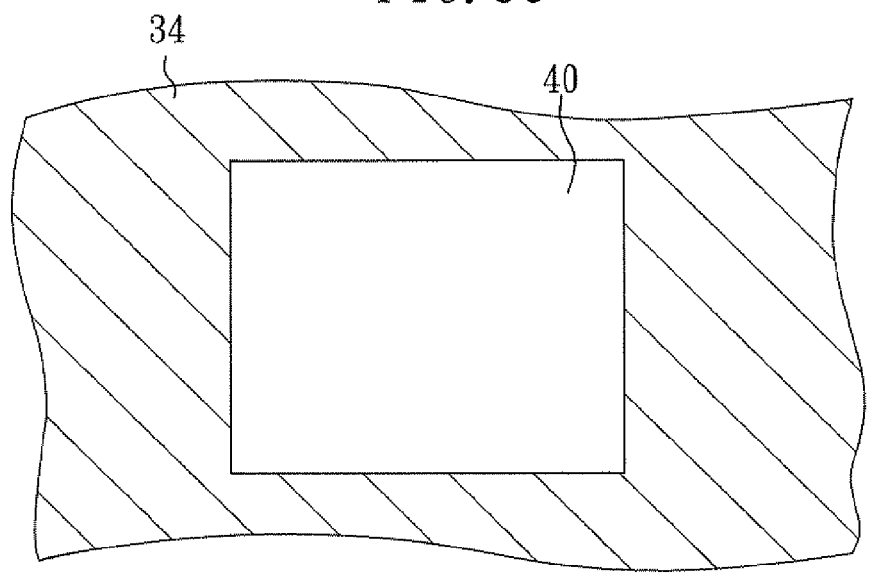

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of a laminated structure that includes substrate 34 and conductive layer 36. For instance, substrate 34 is a glass-epoxy material with a thickness of 150 microns and conductive layer 36 that contacts and extends above and is laminated to substrate 34 is an unpatterned copper sheet with a thickness of 30 microns.

FIGS. 3B, 3C and 3D are cross-sectional, top and bottom views, respectively, of the laminated structure of substrate 34 and conductive layer 36 with aperture 40. Aperture 40 is a window that extends through substrate 34 and conductive layer 36 and has a dimension of 10.55 mm by 8.55 mm. Aperture 40 is formed by punching through substrate 34 and conductive layer 36 and can be formed with other techniques such as laser cutting. Thus, opening 32 and aperture 40 have the same dimension. Furthermore, opening 32 and aperture 40 can be formed in the same manner with the same punch at the same punching station.

Substrate 34 is illustrated as a single layer dielectric structure. Substrate 34 can also be an electrical interconnect such as a multi-layer printed circuit board or a multi-layer ceramic board. Accordingly, substrate 34 can include additional layers of embedded circuitry.

Figure 4A:
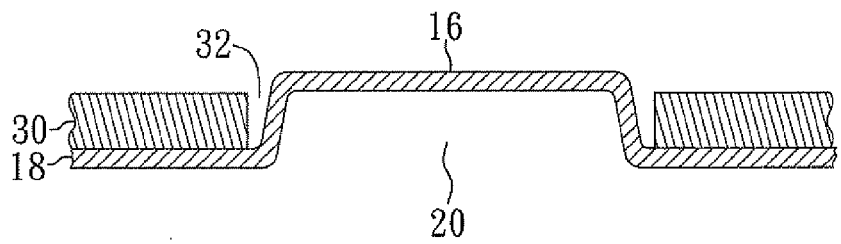
FIGS. 4A-4E are cross-sectional views showing a method of making a thermal board in accordance with an embodiment of the present invention.
Figure 4B:
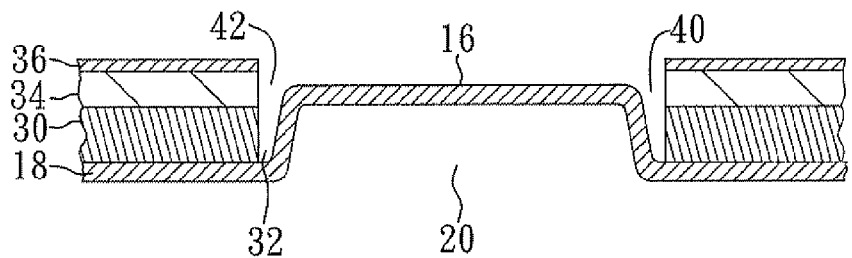
Figure 4C:
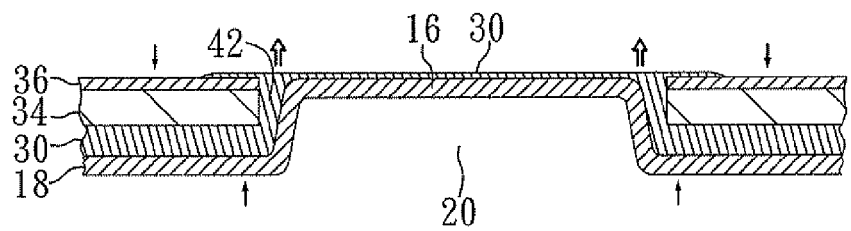
Figure 4D:
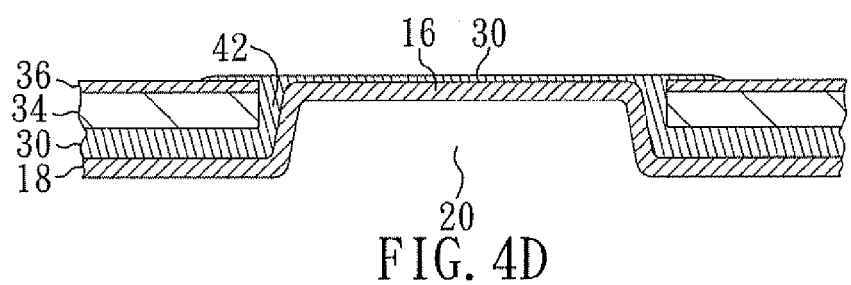
Figure 4E:
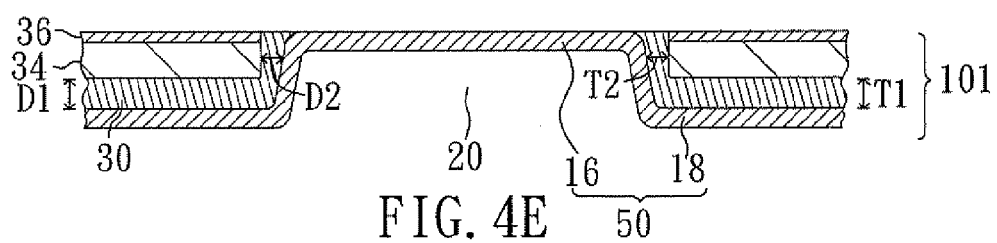

FIGS. 4A-4E are cross-sectional views showing a method of making a thermal board, as shown in FIG. 4E, that includes bump 16, flange 18, adhesive 30, substrate 34 and conductive layer 36 in accordance with an embodiment of the present invention.

In FIGS. 4A and 4B the structure is inverted to a cavity-down position so that gravity assists with mounting adhesive 30 and substrate 34 and conductive layer 36 on flange 18 and in FIGS. 4C-4E the structure remains in the cavity-down position. Thereafter, in FIGS. 5A-5J the structure is inverted again to the cavity-up position as in FIGS. 1A-1D. Thus, cavity 20 faces downward in FIGS. 4A-4E and upward in FIGS. 5A-5J. However, the relative orientation of the structure does not change. Cavity 20 faces in the first vertical direction and is covered by bump 16 in the second vertical direction regardless of whether the structure is inverted, rotated or slanted. Likewise, bump 16 extends beyond substrate 34 in the first vertical direction and extends from flange 18 in the second vertical direction regardless of whether the structure is inverted, rotated or slanted. Hence, the first and second vertical directions are oriented relative to the structure and remain opposite to one another and orthogonal to the lateral directions.

FIG. 4A is a cross-sectional view of the structure with adhesive 30 mounted on flange 18. Adhesive 30 is mounted by lowering it onto flange 18 as bump 16 is inserted into and through and upwards in opening 32. Adhesive 30 eventually contacts and rests on flange 18. Preferably, bump 16 is inserted into and extends through opening 32 without contacting adhesive 30 and is aligned with and centrally located within opening 32.

FIG. 4B is a cross-sectional view of the structure with substrate 34 and conductive layer 36 mounted on adhesive 30. Substrate 34 laminated with conductive layer 36 is mounted by lowering it onto adhesive 30 as bump 16 is inserted into and upwards in aperture 40. Substrate 34 eventually contacts and rests on adhesive 30.

Bump 16 is inserted into but not through aperture 40 without contacting substrate 34 and is aligned with and centrally located within aperture 40. As a result, gap 42 is located in aperture 40 between bump 16 and substrate 34. Gap 42 laterally surrounds bump 16 and is laterally surrounded by substrate 34. In addition, opening 32 and aperture 40 are precisely aligned with one another and have the same dimension.

At this stage, substrate 34 laminated with conductive layer 36 is mounted on and contacts and extends above adhesive 30. Bump 16 extends through opening 32 into aperture 40, is 30 microns below the top surface of conductive layer 36 and is exposed through aperture 40 in the upward direction. Adhesive 30 contacts and is sandwiched between flange 18 and substrate 34, contacts substrate 34 but is spaced from conductive layer 36 and remains a non-solidified prepreg with B-stage uncured epoxy, and gap 42 is filled with air.

FIG. 4C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to flange 18, thereby moving flange 18 and substrate 34 towards one another and applying pressure to adhesive 30 while simultaneously applying heat to adhesive 30. Adhesive 30 becomes compliant enough under the heat and pressure to conform to virtually any shape. As a result, adhesive 30 sandwiched between flange 18 and substrate 34 is compressed, forced out of its original shape and flows into and upward in gap 42. Flange 18 and substrate 34 continue to move towards one another and adhesive 30 eventually fills gap 42. Moreover, adhesive 30 remains sandwiched between and continues to fill the reduced space between flange 18 and substrate 34.

For instance, flange 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between flange 18 and the bottom platen. The stack includes the top platen, top cull plate, top buffer paper, substrate 34 and conductive layer 36, adhesive 30, flange 18, bottom buffer paper, bottom cull plate and bottom platen in descending order. Furthermore, the stack may be positioned on the bottom platen by tooling pins (not shown) that extend upward from the bottom platen through registration holes (not shown) in flange 18.

The platens are heated and move towards one another, thereby applying heat and pressure to adhesive 30. The cull plates disperse the heat from the platens so that it is more uniformly applied to flange 18 and substrate 34 and thus adhesive 30, and the buffer papers disperse the pressure from the platens so that it is more uniformly applied to flange 18 and substrate 34 and thus adhesive 30. Initially, substrate 34 contacts and presses down on adhesive 30. As the platen motion and heat continue, adhesive 30 between flange 18 and substrate 34 is compressed, melted and flows into and upward in gap 42 and across substrate 34 to conductive layer 36. For instance, the uncured epoxy is melted by the heat and the molten uncured epoxy is squeezed by the pressure into gap 42, however the reinforcement and the filler remain between flange 18 and substrate 34. Adhesive 30 elevates more rapidly than bump 16 in aperture 40 and fills gap 42. Adhesive 30 also rises slightly above aperture 40 and overflows onto the top surfaces of bump 16 and conductive layer 36 before the platen motion stops. This may occur due to the prepreg being slightly thicker than necessary. As a result, adhesive 30 creates a thin coating on the top surfaces of bump 16 and conductive layer 36. The platen motion is eventually blocked by bump 16 and the platens become stationary but continue to apply heat to adhesive 30.

The upward flow of adhesive 30 in gap 42 is shown by the thick upward arrows, the upward motion of bump 16 and flange 18 relative to substrate 34 is shown by the thin upward arrows, and the downward motion of substrate 34 relative to bump 16 and flange 18 is shown by the thin downward arrows.

FIG. 4D is a cross-sectional view of the structure with adhesive 30 solidified.

For instance, the platens continue to clamp bump 16 and flange 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and substrate 34 and between flange 18 and substrate 34. Adhesive 30 can withstand normal operating pressure without distortion or damage and is only temporarily distorted under unusually high pressure. Furthermore, adhesive 30 can absorb thermal expansion mismatch between bump 16 and substrate 34 and between flange 18 and substrate 34.

At this stage, bump 16 and conductive layer 36 are essentially coplanar with one another and adhesive 30 and conductive layer 36 extend to a top surface that faces in the upward direction. For instance, adhesive 30 between flange 18 and substrate 34 has a thickness of 120 microns which is 30 microns less than its initial thickness of 150 microns, bump 16 ascends 30 microns in aperture 40 and substrate 34 descends 30 microns relative to bump 16. The 300 micron height of bump 16 is essentially the same as the combined height of conductive layer 36 (30 microns), substrate 34 (150 microns) and the underlying adhesive 30 (120 microns). Furthermore, bump 16 continues to be centrally located in opening 32 and aperture 40 and spaced from substrate 34 and adhesive 30 fills the space between flange 18 and substrate 34 and fills gap 42. Adhesive 30 extends across substrate 34 in gap 42. That is, adhesive 30 in gap 42 extends in the upward and downward directions across the thickness of substrate 34 at the outer sidewall of gap 42. Adhesive 30 also includes a thin top portion above gap 42 that contacts the top surfaces of bump 16 and conductive layer 36 and extends above bump 16 by 10 microns.

FIG. 4E is a cross-sectional view of the structure after upper portions of bump 16, adhesive 30 and conductive layer 36 are removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 20 micron thick upper portion of adhesive 30, a 10 micron thick upper portion of bump 16 and a 10 micron thick upper portion of conductive layer 36. The decreased thickness does not appreciably affect bump 16 or adhesive 30. However, it substantially reduces the thickness of conductive layer 36 from 30 microns to 20 microns. After the grinding, bump 16, adhesive 30 and conductive layer 36 are coplanar with one another at a smoothed lapped lateral top surface that is above substrate 34 and faces in the upward direction.

At this stage, as shown in FIG. 4E, thermal board 101 includes adhesive 30, substrate 34, conductive layer 36 and heat spreader 50. Heat spreader 50 includes bump 16 and flange 18. Bump 16 is adjacent to flange 18 at bent corner 22, extends from flange 18 in the upward direction and is integral with flange 18. Bump 16 extends into and remains centrally located within opening 32 and aperture 40, and is coplanar at its top with an adjacent portion of adhesive 30. Bump 16 is spaced from substrate 34 and retains its cut-off pyramidal shape in which its dimension increases as it extends downwardly.

Cavity 20 faces in the downward direction, extends into remains centrally located within bump 16, opening 32 and aperture 40 and is covered by bump 16 in the upward direction. Cavity 20 conforms to the shape of bump 16, extends across most of bump 16 in the vertical and lateral directions and retains its cut-off pyramidal shape in which its dimension decreases as it extends upwardly from its entrance at flange 18.

Flange 18 extends laterally from bump 16, extends below adhesive 30, substrate 34, opening 32 and aperture 40, contacts adhesive 30 and is spaced from substrate 34.

Adhesive 30 contacts and is sandwiched between and fills the space between bump 16 and substrate 34 in gap 42 and contacts substrate 34 and flange 18 outside gap 42. Adhesive 30 covers and surrounds tapered sidewall 26 of bump 16 in the lateral directions, extends laterally from bump 16 to peripheral edges of the assembly and is solidified. Accordingly, adhesive 30 has first thickness T1 where it is adjacent to flange 18 and second thickness T2 where it is adjacent to bump 16 that is different from first thickness T1. That is, distance D1 in the vertical directions between flange 18 and substrate 34 is different from distance D2 in the lateral directions between bump 16 and substrate 34. Furthermore, as adhesive 30 extends away from flange 18 into gap 42 between bump 16 and substrate 34, adhesive 30 can have an increasing thickness where it is adjacent to bump 16 owing to that bump 16 has an increasing dimension as it extends towards flange 18. Thermal board 101 can accommodate multiple semiconductor devices rather than one with a single bump or multiple bumps. Thus, multiple semiconductor devices can be mounted on a single bump or separate semiconductor devices can be mounted on separate bumps.

Thermal board 101 with multiple bumps for multiple semiconductor devices can be accomplished by stamping metal plate 10 to include additional bumps 16, adjusting adhesive 30 to include additional openings 32 and adjusting substrate 34 and conductive layer 36 to include additional apertures 40.

FIGS. 5A-5J are cross-sectional views showing a method of making a semiconductor assembly that includes a thermal board, a semiconductor device and build-up circuitry in accordance with an embodiment of the present invention.

Figure 5A:
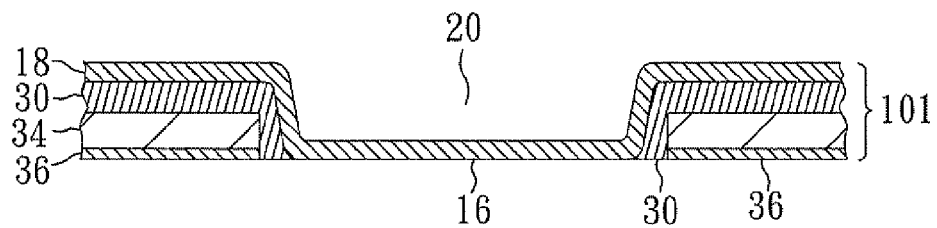
FIGS. 5A-5J are cross-sectional views showing a method of making a semiconductor assembly that includes a thermal board, a semiconductor chip and build-up circuitry in accordance with an embodiment of the present invention.
Figure 5B:
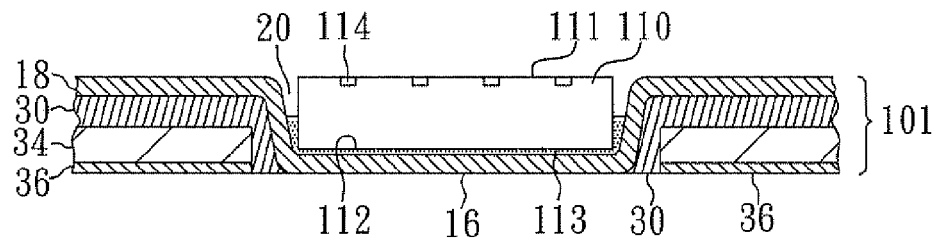
Figure 5C:
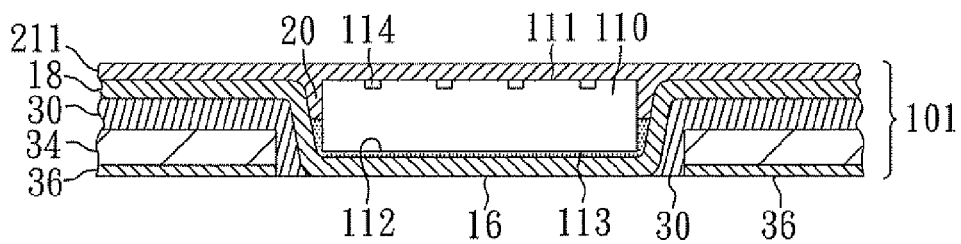
Figure 5D:
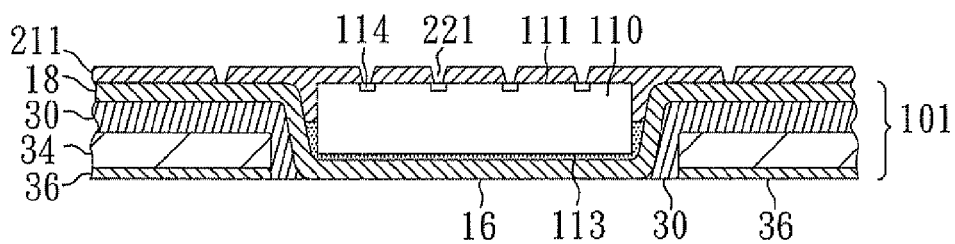
Figure 5E:
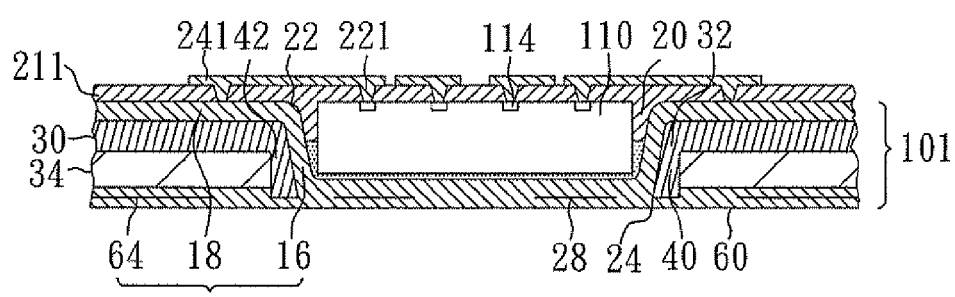
Figure 5F:
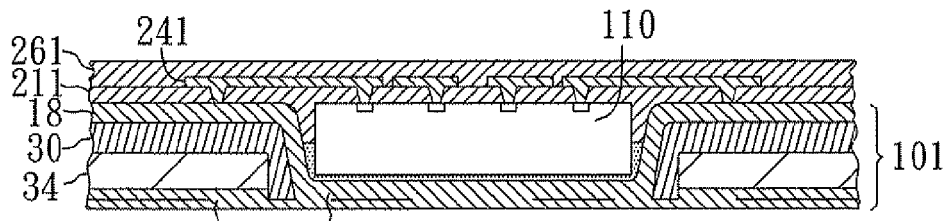
Figure 5G:
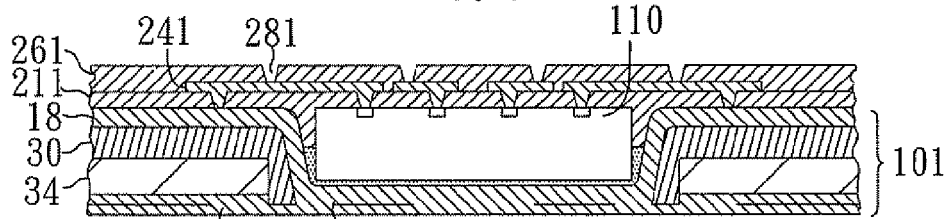
Figure 5H:
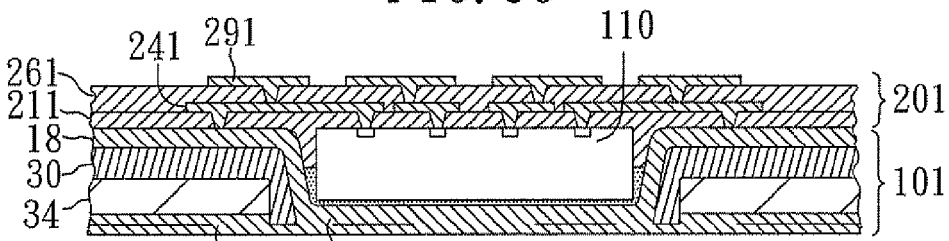
Figure 5I:
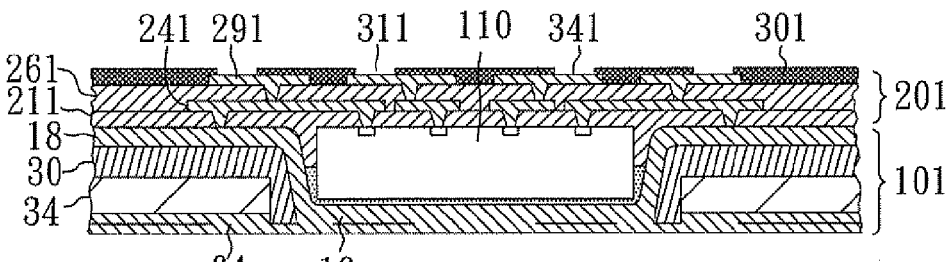
Figure 5J:
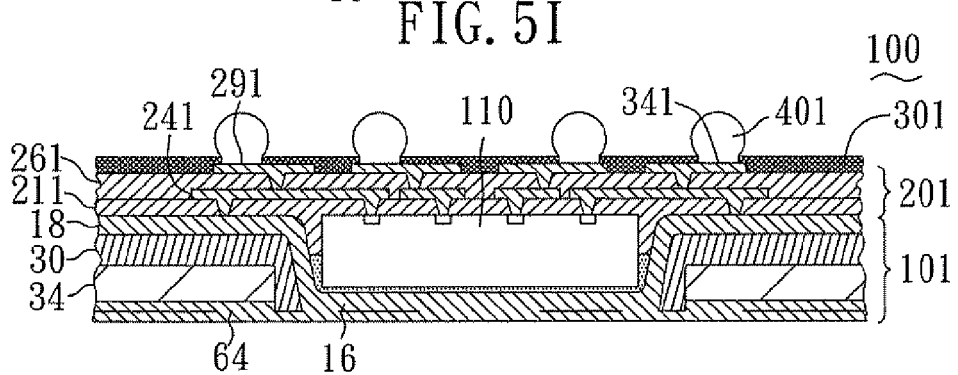

As shown in FIG. 5J, semiconductor assembly 100 includes thermal board 101, semiconductor chip 110, die attach 113, build-up circuitry 201, solder mask material 301 and solder balls 401. Thermal board 101 includes adhesive 30, substrate 34 and heat spreader 50. Heat spreader 50 includes bump 16, flange 18 and base 64. Semiconductor chip 110 includes top surface 111, bottom surface 112 and contact pads 114. Top surface 111 is the active surface and includes contact pads 114 and bottom surface 112 is the thermal contact surface. Build-up circuitry 201 includes first dielectric layer 211, first conductive traces 241, second dielectric layer 261 and second conductive traces 291.

FIG. 5A is a cross-sectional view of thermal board 101 after it is inverted from FIG. 4E.

FIG. 5B is a cross-sectional view of thermal board 101 with semiconductor chip 110 mounted on bump 16 by die attach 113. Semiconductor chip 110, which includes contact pads 114 on its top surface 111 (i.e. active surface), is mounted by lowering it into cavity 20, and eventually contacts and rests on die attach 113. In particular, bump 16 covers semiconductor chip 110 in the downward direction and provides a recessed die paddle for semiconductor chip 110. Die attach 113 contacts and is sandwiched between bump 16 and semiconductor chip 110.

Die attach 113 is initially a silver-filled epoxy paste with high thermal conductivity that is selectively screen printed into cavity 20 on bump 16 and then semiconductor chip 110 placed on the epoxy paste using a pick-up head and an automated pattern recognition system in step-and-repeat fashion. Thereafter, the epoxy paste is heated and hardened at a relatively low temperature such as 190° C. to form hardened die attach 113. Semiconductor chip 110 has a thickness of 275 microns and die attach 113 has a thickness of 20 microns. As a result, the combined height of semiconductor chip 110 and the underlying die attach 113 is 295 microns which is 5 microns less than the depth of cavity 20 (300 microns). Semiconductor chip 110 has a length of 10 mm and width of 8 mm.

Subsequently, build-up circuitry is formed on thermal board 101 and semiconductor chip 110 as described below.

FIG. 5C is a cross-sectional view of the structure with first dielectric layer 211, such as epoxy resin, glass-epoxy, polyimide, and the like, disposed over the semiconductor chip top surface 111 (i.e. active surface), contact pads 114, die attach 113, bump 16, and flange 18. First dielectric layer 211 extends into and fills the remaining space in cavity 20, thereby contacting bump 16, semiconductor chip 110 and die attach 113 in cavity 20 and is sandwiched between bump 16 and semiconductor chip 110 in cavity 20. First dielectric layer 211 also contacts flange 18 outside cavity 20 and is spaced from adhesive 30. First dielectric layer 211 may be deposited by numerous techniques including lamination, roll coating, spin coating and spray-on deposition. First dielectric layer 211 may be treated by plasma etching or coated with an adhesion promoter (not shown) to promote adhesion before deposition. First dielectric layer 211 has a thickness of approximately 50 microns.

FIG. 5D is a cross-sectional view of the structure showing first via openings 221 formed through first dielectric layer 211. First via openings 221 are aligned with and expose contact pads 114 and selected portions of flange 18. First via openings 221 may be formed by numerous techniques including laser drilling, plasma etching and photolithography. Laser drilling can be enhanced using a pulsed laser. Alternatively, a scanning laser beam with a metal mask can be used. First via openings 221 have a diameter of approximately 50 microns.

Referring now to FIG. 5E, first conductive traces 241 are formed on first dielectric layer 211. First conductive traces 241 extend from first dielectric layer 211 in the upward direction, extend laterally on first dielectric layer 211 and extend into first via openings 221 in the downward direction to make electrical contact with contact pads 114 of semiconductor chip 110 and flange 18. First conductive trace 241 can be deposited by numerous techniques including electrolytic plating, electro-less plating, evaporating, sputtering, and their combinations.

For instance, first conductive traces 241 are deposited as a first conductive layer by first dipping the structure in an activator solution to render adhesive 30 and first dielectric layer 211 catalytic to electroless copper, then a thin copper layer is electrolessly plated to serve as the seeding layer before a second copper layer is electro-plated on the seeding layer to a desirable thickness. Alternatively, the seeding layer can be formed by sputtering a thin film such as titanium/copper onto first dielectric layer 211 as well as into the first via openings 221 before depositing the electro-plated copper layer on the seeding layer. Once the desired thickness is achieved, the first conductive layer (i.e. the combination of the electro-plated copper layer and the seeding layer) is patterned to form first conductive traces 241 by numerous techniques including wet etching, electro-chemical etching, laser-assist etching, and their combinations with an etch mask (not shown) thereon that defines first conductive traces 241.

Also shown in FIG. 5E is plated layer 60 deposited on bump 16, adhesive 30 and conductive layer 36. Plated layer 60 can be deposited by the same solution as first conductive traces 241. Preferably, plated layer 60 and first conductive traces 241 are the same material deposited simultaneously in the same manner. Plated layer 60 is deposited on and contacts bump 16, adhesive 30 and conductive layer 36 at the lateral bottom surface and covers them in the downward direction. Bump 16, conductive layer 36 and plated layer 60 are shown as a single layer for convenience of illustration. The boundary (shown in phantom) between bump 16 and plated layer 60 and between conductive layer 36 and plated layer 60 may be difficult or impossible to detect since copper is plated on copper. However, the boundary between adhesive 30 and plated layer 60 is clear.

First conductive traces 241 are shown in cross-section as a continuous circuit traces for convenience of illustration. That is, first conductive traces 241 can provide horizontal signal routing in both the X and Y directions and vertical (top to bottom) routing through first via openings 221 and serve as electrical connections for semiconductor chip 110 and flange 18.

Plated layer 60 is an unpatterned copper layer and serves as a portion of base 64. Base 64 is adjacent to and extends below and laterally from and is thermally connected to bump 16 and covers bump 16 and flange 18 in the downward direction. Base 64 has a thickness of plated layer 60 where it is adjacent to bump 16 and a combined thickness of plated layer 60 and conductive layer 36 where it is adjacent to substrate 34.

At this stage, as shown in FIG. 5E, thermal board 101 includes adhesive 30, substrate 34, and heat spreader 50. Heat spreader 50 includes bump 16, flange 18 and base 64. The build-up circuitry on thermal board 101 and semiconductor chip 110 includes first dielectric layer 211 and first conductive traces 241.

Bump 16 is adjacent to flange 18 at bent corner 22, is adjacent to base 64 at bent corner 24 and at floor 28, extends from base 64 in the upward direction, extends from flange 18 in the downward direction and is integral with flange 18. Bump 16 extends into and remains centrally located within opening 32 and aperture 40, and is coplanar at its bottom with an adjacent portion of adhesive 30 that contacts base 64.

Bump 16 also contacts adhesive 30, is spaced from substrate 34 and retains its cut-off pyramidal shape in which its dimension increases as it extends upwardly from base 64 to flange 18.

Base 64 extends laterally from bump 16, extends laterally beyond opening 32 and aperture 40 and covers bump 16, opening 32 and aperture 40 in the downward direction. Base 64 contacts adhesive 30 and substrate 34, extends beyond adhesive 30 and substrate 34 in the downward direction, supports adhesive 30 and substrate 34 and extends to the peripheral edges of thermal board 101. Base 64 has a first thickness where it is adjacent to bump 16, a second thickness where it is adjacent to substrate 34 that is larger than the first thickness and a flat surface that faces in the downward direction.

Adhesive 30 contacts and is sandwiched between and fills the space between bump 16 and substrate 34 in gap 42, contacts substrate 34 and flange 18 outside gap 42, and contacts base 64. Adhesive 30 extends between bump 16 and flange 18, extends between bump 16 and base 64, is sandwiched between flange 18 and base 64, and is sandwiched between flange 18 and substrate 34. Adhesive 30 also extends laterally from bump 16 to peripheral edges of the assembly and is solidified. Adhesive 30 covers and surrounds tapered sidewall 26 of bump 16 in the lateral directions, covers base 64 outside the periphery of bump 16 in the upward direction, covers substrate 34 in the upward direction and covers flange 18 in the downward direction. Adhesive 30 has a first thickness where it is adjacent to the flange 18 and a second thickness where it is adjacent to the bump 16 that is different from the first thickness.

Additional interconnect layers could be applied, if desired.

Heat spreader 50 provides heat spreading and heat dissipation from semiconductor device 110 mounted on bump 16. Semiconductor device 110 generates heat that flows into bump 16 and through bump 16 into base 64 where it is spread out and dissipated in the downward direction, for instance to an underlying heat sink.

FIG. 5F is a cross-sectional view of the structure showing second dielectric layer 261 disposed on first conductive traces 241 and first dielectric layer 211. Like first dielectric layer 211, second dielectric layer 261 can be deposited by numerous techniques including film lamination, spin coating, roll coating, and spray-on deposition.

FIG. 5G is a cross-sectional view of the structure showing second via openings 281 formed through second dielectric layer 261. Second via openings 281 are aligned with and expose first conductive traces 241. Second via openings 281 can be formed by numerous techniques including laser drilling, plasma etching and photolithography.

FIG. 5H is the cross-sectional view of the structure showing second conductive traces 291 formed on second dielectric layer 261. Second conductive traces 291 extend from second dielectric layer 261 in the upward direction, extend laterally on second dielectric layer 261 and extend into second via openings 281 in the downward direction to make electrical contact with first conductive traces 241, and therefore electrical connection with semiconductor chip 110 and flange 18. Accordingly, build-up circuitry 201, which includes first dielectric layer 211, first conductive traces 241, second dielectric layer 261 and second conductive traces 291, is accomplished.

FIG. 5I is the cross-sectional view of the structure showing solder mask material 301 disposed over second dielectric layer 261 and second conductive traces 291. Solder mask material 301 includes openings 311 that expose selected portions of second conductive traces 291 to define terminal pads 341. Solder mask openings 311 may be formed by numerous techniques including photolithography, laser drilling and plasma etching. Terminal pads 341 can be used in the formation of conductive interconnects, such as solder bumps, solder balls, pins and the like, for communication with external components or a PCB.

FIG. 5J is the cross-sectional view of the structure showing solder balls 401 deposited on terminal pads 341. Solder balls 401 can be formed by numerous techniques including screen printing solder paste followed by a reflow process or by known plating techniques.

Additional interconnect layers could be applied until terminal pads 341 are in an appropriate position. Various methods of depositing dielectric layers 211, 261, various methods of forming via openings 221, 281, and various methods of forming conductive traces 241, 291 can be found in the literature.

Embodiment 2

Figure 6:
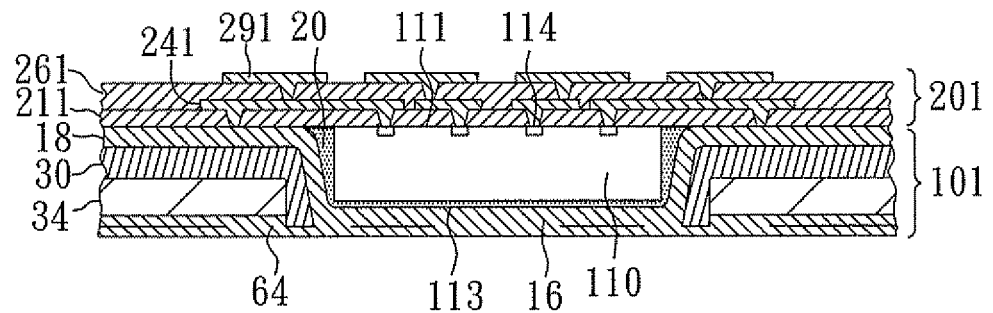
FIG. 6 is a cross-sectional view showing a semiconductor assembly that includes a thermal board with the first dielectric layer spaced from the cavity in accordance with another embodiment of the present invention.

FIG. 6 is a cross-sectional view showing a semiconductor assembly that includes a thermal board with a substrate where first dielectric layer 211 is spaced from cavity 20 in accordance with another embodiment of the present invention.

In this embodiment, the semiconductor assembly is manufactured in a manner similar to that illustrated in Embodiment 1, except that die attach 113 fills the remaining space in cavity 20. As a result, die attach 113 fills the gap between bump 16 and semiconductor chip 110, and first dielectric layer 211 is deposited over the semiconductor chip top surface 111 (i.e. active surface), and contacts contact pads 114, die attach 113 and flange 18, but does not contact bump 16 and does not extend into cavity 20. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Embodiment 3

Figure 7:
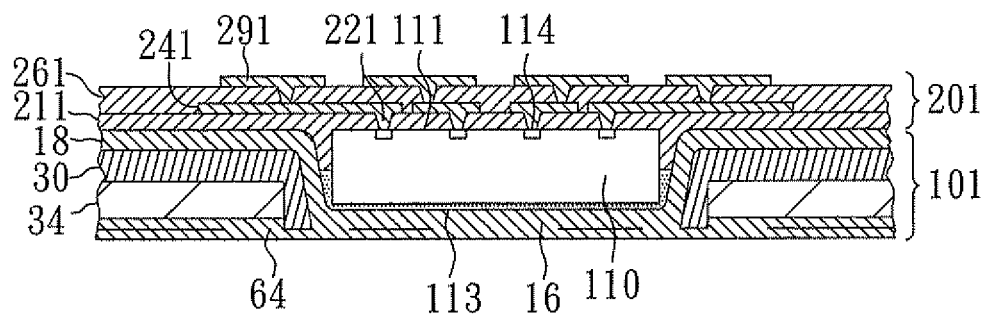
FIG. 7 is a cross-sectional view showing a semiconductor assembly that includes a thermal board with the first conductive traces spaced from the flange in accordance with yet another embodiment of the present invention.

FIG. 7 is a cross-sectional view showing a semiconductor assembly that includes a thermal board with a substrate where first conductive traces 241 are spaced from flange 18 in accordance with yet another embodiment of the present invention.

In this embodiment, the semiconductor assembly is manufactured in a manner similar to that illustrated in Embodiment 1, except that flange 18 is not exposed by first via openings 221, first conductive traces 241 do not extend to flange 18, and thus no electrical connection for flange 18 is provided. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Embodiment 4

Figure 8:
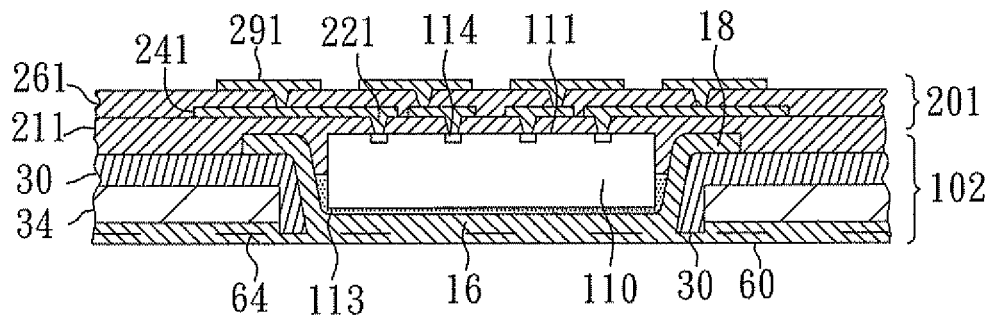
FIG. 8 is a cross-sectional view showing a semiconductor assembly that includes a thermal board with the flange spaced from the peripheral edges of the assembly in accordance with further another embodiment of the present invention.

FIG. 8 is a cross-sectional view showing a semiconductor assembly that includes thermal board 102 with a substrate where flange 18 is spaced from the peripheral edges of the assembly in accordance with further another embodiment of the present invention.

In this embodiment, a portion of flange 18 is removed, and flange 18 extends laterally from bump 16 but does not extend to peripheral edges of the assembly. In addition, flange 18 is not exposed by first via openings 221, and thus no electrical connection for flange 18 is provided. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Thermal board 102 can be manufactured in a manner similar to thermal board 101 illustrated in Embodiment 1, except removing a portion of flange 18 is further performed before the formation of first dielectric layer 211 and first via openings 221 are formed to expose contact pads 114 but not flange 18. Accordingly, first dielectric layer 211 is disposed over the semiconductor chip top surface 111 (i.e. active surface), contact pads 114, die attach 113, bump 16, flange 18 and adhesive 30 and contacts adhesive 30.

Embodiment 5

Figure 9:
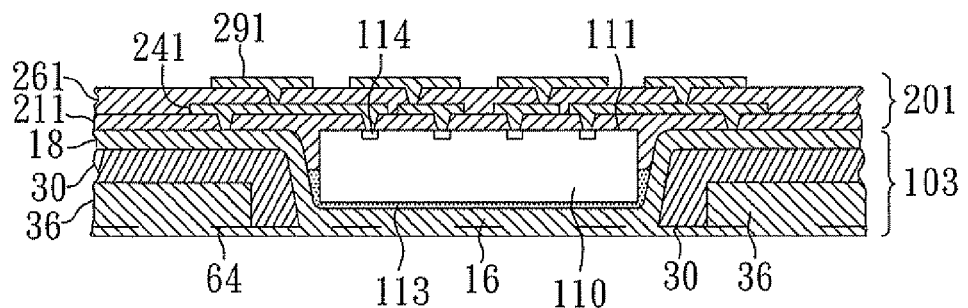
FIG. 9 is a cross-sectional view showing a semiconductor assembly that includes a thermal board without a substrate in accordance with an embodiment of the present invention.

FIG. 9 is a cross-sectional view showing a semiconductor assembly that includes a thermal board 103 without a substrate in accordance with an embodiment of the present invention.

In this embodiment, a thick conductive layer 36 is applied and the substrate is omitted. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Conductive layer 36 is thicker in this embodiment than in Embodiment 1. For instance, conductive layer 36 has a thickness of 130 microns (rather than 30 microns) so that it can be handled without warping or wobbling. Base 64 is therefore thicker, and thermal board 103 is devoid of a substrate. Accordingly, base 64 has a first thickness where it is adjacent to the bump 16 and a second thickness where it is adjacent to the adhesive 30 that is larger than the first thickness. In addition, as mentioned in Embodiment 1, adhesive 30 can have a first thickness where it is adjacent to flange 18 and a second thickness where it is adjacent to bump 16 that is different from the first thickness. That is, the distance in the vertical directions between flange 18 and conductive layer 36 (a part of base 64) can be different from the distance in the lateral directions between bump 16 and conductive layer 36. Furthermore, as mentioned in Embodiment 1, as adhesive 30 extends into the gap between bump 16 and conductive layer 36 in the downward direction, adhesive 30 can have an increasing thickness where it is adjacent to bump 16 owing to that bump 16 has an increasing dimension as it extends in the upward direction.

Thermal board 103 can be manufactured in a manner similar to thermal board 101 with suitable adjustments for conductive layer 36. For instance, adhesive 30 is mounted on flange 18, conductive layer 36 alone is mounted on adhesive 30, heat and pressure are applied to flow and solidify adhesive 30, and grinding is applied to planarize bump 16, adhesive 30 and conductive layer 36 at a lateral surface. Accordingly, adhesive 30 contacts bump 16, base 64 and flange 18, and laterally covers and surrounds and conformally coats tapered sidewall 26 of bump 16.

Embodiment 6

Figure 10:
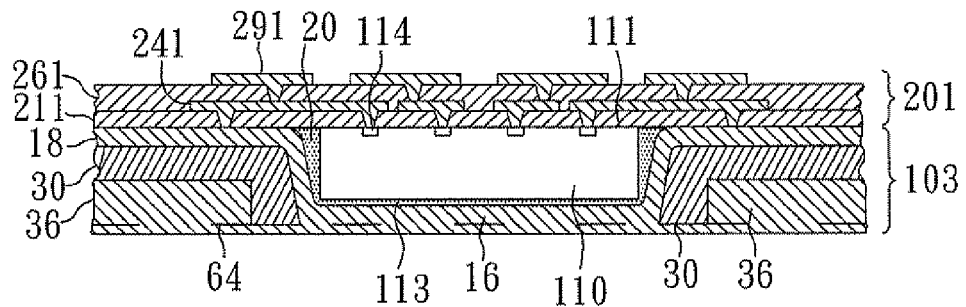
FIG. 10 is a cross-sectional view showing a semiconductor assembly that includes a thermal board without a substrate and the first dielectric layer spaced from the cavity in accordance with another embodiment of the present invention.

FIG. 10 is a cross-sectional view showing a semiconductor assembly that includes a thermal board without a substrate where first dielectric layer 211 does not extend into cavity 20 in accordance with another embodiment of the present invention.

In this embodiment, the semiconductor assembly is manufactured in a manner similar to that illustrated in Embodiment 5, except that die attach 113 fills the gap between bump 16 and semiconductor chip 110, and thus first dielectric layer 211 is deposited over semiconductor chip top surface 111 (i.e. active surface), and contacts contact pads 114, die attach 113 and flange 18, but does not contact the bump 16 and does not extend into cavity 20. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Embodiment 7

Figure 11:
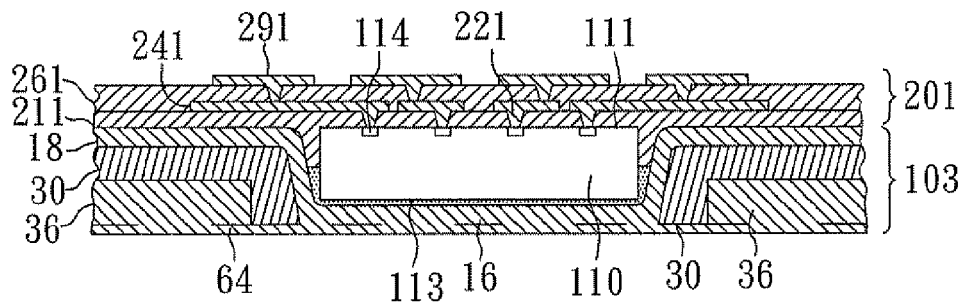
FIG. 11 is a cross-sectional view showing a semiconductor assembly that includes a thermal board without a substrate and the first conductive traces spaced from the flange in accordance with yet another embodiment of the present invention.

FIG. 11 is a cross-sectional view showing a semiconductor assembly that includes a thermal board without a substrate where first conductive traces 241 are spaced from flange 18 in accordance with yet another embodiment of the present invention.

In this embodiment, the semiconductor assembly is manufactured in a manner similar to that illustrated in Embodiment 5, except that flange 18 is not exposed by first via openings 221, first conductive traces 241 do not extend to flange 18, and thus no electrical connection for flange 18 is provided. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Embodiment 8

Figure 12:
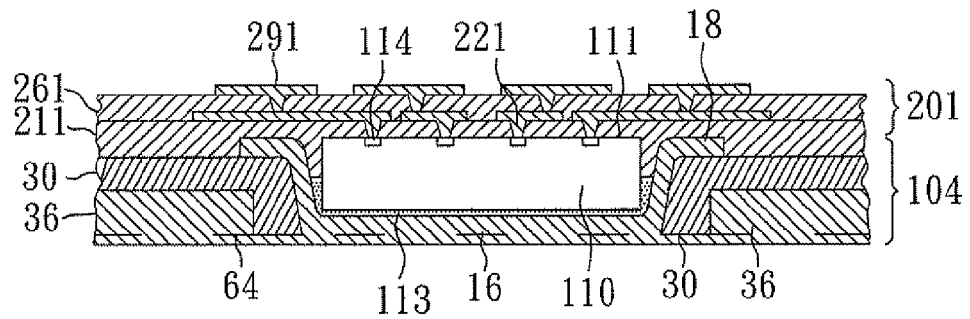
FIG. 12 is a cross-sectional view showing a semiconductor assembly that includes a thermal board without a substrate and the flange spaced from the peripheral edges of the assembly in accordance with still another embodiment of the present invention.

FIG. 12 is a cross-sectional view showing a semiconductor assembly that includes a thermal board 104 without a substrate where flange 18 is spaced from the peripheral edges of the assembly in accordance with still another embodiment of the present invention.

In this embodiment, a portion of flange 18 is removed, and flange 18 extends laterally from bump 16 but does not extend to peripheral edges of the assembly. In addition, the flange 18 is not exposed by first via openings 221, and thus no electrical connection for flange 18 is provided. For purposes of brevity, any description of thermal board 101 and build-up circuitry 201 is incorporated herein insofar as the same is applicable, and the same description need not be repeated. Likewise, elements of the thermal board and build-up circuitry similar to those in thermal board 101 and build-up circuitry 201 have corresponding reference numerals.

Thermal board 104 can be manufactured in a manner similar to thermal board 103 illustrated in Embodiment 5, except that removing a portion of flange 18 is performed before the formation of first dielectric layer 211 and first via openings 221 are formed to expose contact pads 114 but not flange 18. Accordingly, first dielectric layer 211 is disposed over the semiconductor chip top surface 111 (i.e. active surface), contact pads 114, die attach 113, bump 16, flange 18 and adhesive 30 and contacts flange 18 and adhesive 30.

The semiconductor assemblies and thermal boards described above are merely exemplary. Numerous other embodiments are contemplated. In addition, the embodiments described above can be mixed-and-matched with one another and with other embodiments depending on design and reliability considerations. For instance, the substrate can include ceramic material or epoxy-based laminate, and can have embedded single-level conductive traces or multi-level conductive traces. The thermal board can include multiple bumps arranged in an array for multiple semiconductor devices and the build-up circuitry can include additional conductive traces to accommodate the additional semiconductor devices.

The semiconductor device can share or not share the heat spreader with other semiconductor devices. For instance, a single semiconductor device can be mounted on the heat spreader. Alternatively, numerous semiconductor devices can be mounted on the heat spreader. For instance, four small chips in a 2×2 array can be attached to the bump and the build-up circuitry can include additional conductive traces to receive and route additional contact pads. This may be more cost effective than providing a miniature bump for each chip.

The semiconductor device can be a packaged or unpackaged chip. Furthermore, the semiconductor device can be a bare chip, WA, or QFN, etc. The semiconductor device can be mechanically, electrically and thermally connected to the thermal board using a wide variety of connection media including solder and electrically and/or thermally conductive die attach.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a bump and a flange that are integral with one another and a base that is metallurgically bonded and thermally connected to the bump, thereby enhancing reliability and reducing cost. Furthermore, the bump can be customized for the semiconductor device and the base can be customized for the next level assembly, thereby enhancing the thermal connection from the semiconductor device to the next level assembly. For instance, the bump can have a square or rectangular shape at its floor with the same or similar topography as the thermal contact of the semiconductor device. In any case, the heat spreader can be a wide variety of thermally conductive metallic structures.

The heat spreader can be electrically connected to or isolated from the semiconductor device. For instance, the first conductive traces extending into the first via openings above the contact pads and the flange can electrically connect the semiconductor device to the flange and the bump. Thereafter, the heat spreader can be electrically connected to ground, thereby electrically connecting the semiconductor device to ground and providing electro-magnetic shielding.

The base can provide a critical thermal dissipation channel for the assembly. The base can include fins at its backside that protrude in the downward direction, For instance, the base can be cut at its exposed lateral surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The base can be formed by numerous deposition techniques including electro-plating, electroless plating, evaporating and sputtering as a single layer or multiple layers after the adhesive is solidified. The base can be the same metal as or a different metal than the bump. Furthermore, the base can extend across the aperture to the substrate or reside within the periphery of the aperture. Thus, the base may contact or be spaced from the substrate. In any case, the base is adjacent to the bump and extends vertically from the bump opposite the cavity.

The adhesive can provide a robust mechanical bond between the heat spreader and the substrate. For instance, the adhesive can extend laterally from the bump beyond the conductive traces to the peripheral edges of the assembly, the adhesive can fill the space between the heat spreader and the substrate and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error.

The substrate can provide critical mechanical support for the thermal board. For instance, the substrate can prevent the thermal board from warping during metal grinding, chip mounting and build-up circuitry formation. The substrate can be a low cost material that need not have high thermal conductivity. Accordingly, the substrate can be made of conventional organic materials such as epoxy, glass-epoxy, polyimide, etc. The substrate can also be made of thermally conductive materials such as aluminum oxide ($Al_2O_3$), aluminum nitride (AlN), silicon nitride (SiN), silicon (Si) etc. The substrate can be a single layer structure or a multi-layer structure such as a laminated circuit board or a multi-layer ceramic board. Accordingly, the substrate can include additional layers of embedded circuitry.

The conductive layer can be provided on the substrate then the aperture can be formed in the conductive layer and the substrate, and then the conductive layer and the substrate can be mounted on the adhesive so that the conductive layer is exposed in the upward direction, the substrate contacts and is sandwiched between and separates the conductive layer and the adhesive, and the bump extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the substrate is a permanent part of the thermal board.

The conductive layer alone can be mounted on the adhesive. For instance, the aperture can be formed in the conductive layer and then the conductive layer can be mounted on the adhesive so that the conductive layer contacts the adhesive and is exposed in the upward direction and the bump extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the bump is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned for the base and the terminal. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The build-up circuitry can function as a signal, power or ground layer depending on the purpose of the corresponding semiconductor device pad. The conductive traces can include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The substrate and plated layer and solder mask material are generally desirable but may be omitted in some embodiments. For instance, if a thick conductive layer is needed then the substrate may be omitted to reduce cost.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate and a single plated layer and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single plated layer.

For example, multiple bumps can be stamped in the metal plate, then the non-solidified adhesive with openings corresponding to the bumps can be mounted on the flange such that each bump extends through an opening, then the substrate (with apertures corresponding to the bumps) can be mounted on the adhesive such that each bump extends through an opening into an aperture, then the flange and the substrate can be moved towards one another by platens to force the adhesive into the gaps in the apertures between the bumps and the substrate, then the adhesive can be cured and solidified and then the bumps, the adhesive and the conductive layer can be grinded to form a lateral surface.

The working format for the semiconductor assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

The thermal boards can be detached from one another in a single step or multiple steps. For instance, the thermal boards can be batch manufactured as a panel, then the semiconductor devices can be mounted on the panel and then the semiconductor assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the bump is adjacent to the base and the flange but not the substrate.

The term "overlap" refers to above and extending within a periphery of an underlying element. Overlap includes extending inside and outside the periphery or residing within the periphery. For instance, in the cavity-up position, the semiconductor device overlaps the bump since an imaginary vertical line intersects the semiconductor device and the bump, regardless of whether another element such as the die attach is between the semiconductor device and the bump and is intersected by the line, and regardless of whether another imaginary vertical line intersects the bump but not the semiconductor device (outside the periphery of the semiconductor device). Likewise, the bump overlaps the base, the flange overlaps the adhesive and the base is overlapped by the bump. Moreover, overlap is synonymous with over and overlapped by is synonymous with under or beneath.

The term "contact" refers to direct contact. For instance, the substrate contacts the base but does not contact the bump.

The term "cover" refers to complete coverage in a vertical and/or lateral direction. For instance, in the cavity-up position, the base covers the bump in the downward direction but the bump does not cover the base in the upward direction when the base extends laterally beyond the aperture and contacts the substrate.

The term "layer" refers to patterned and unpatterned layers. For instance, the conductive layer can be an unpatterned blanket sheet on the substrate when the laminated structure including the conductive layer and the substrate is mounted on the adhesive, and the first conductive layer can be a patterned circuit with spaced traces on the first dielectric layer when the semiconductor device is mounted on the heat spreader. Furthermore, a layer can include stacked layers.

The terms "opening" and "aperture" and "hole" refer to a through-hole and are synonymous. For instance, in the cavity-down position, the bump is exposed by the adhesive in the upward direction when it is inserted into the opening in the adhesive. Likewise, the bump is exposed by the laminated structure in the upward direction when it is inserted into the aperture in the laminated structure.

The term "inserted" refers to relative motion between elements. For instance, the bump is inserted into the aperture regardless of whether the flange is stationary and the substrate moves towards the flange, the substrate is stationary and the flange moves towards the substrate or the flange and the substrate both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the flange and the substrate move towards one another regardless of whether the flange is stationary and the substrate moves towards the flange, the substrate is stationary and the flange moves towards the substrate or the flange and the substrate both approach the other.

The phrase "aligned with" refers to relative position between elements, For instance, the bump is aligned with the aperture when the adhesive is mounted on the flange, the substrate and the conductive layer are mounted on the adhesive, the bump is inserted into and aligned with the opening and the aperture is aligned with the opening regardless of whether the bump is inserted into the aperture or is below and spaced from the aperture.

The phrase "mounted on" includes contact and non-contact with a single or multiple support element(s). For instance, the semiconductor device is mounted on the bump regardless of whether it contacts the bump or is separated from the bump by a die attach.

The phrase "adhesive . . . in the gap" refers to the adhesive in the gap. For instance, adhesive that extends across the substrate in the gap refers to the adhesive in the gap that extends across the substrate. Likewise, adhesive that contacts and is sandwiched between the bump and the substrate in the gap refers to the adhesive in the gap that contacts and is sandwiched between the bump at the inner sidewall of the gap and the substrate at the outer sidewall of the gap.

The phrase "the base extends laterally from the bump" refers to lateral extension where the base is adjacent to the bump. For instance, in the cavity-up position, the base extends laterally from the bump when it contacts the adhesive regardless of whether it extends laterally beyond the bump, extends laterally to the flange or covers the bump in the downward direction. Likewise, the base does not extend laterally beyond the bump when it is coextensive with the bump at its floor.

The phrase "electrically connecting" or "electrically connected" refers to direct and indirect electrical connection. For instance, the contact pads of the semiconductor device is adjacent to and electrically connected to the first conductive traces, and is spaced from and electrically connected to the second conductive traces by the first conductive traces.

The term "above" refers to upward extension and includes adjacent and non-adjacent elements as well as overlapping and non-overlapping elements. For instance, in the cavity-up position, the bump extends above, is adjacent to, overlaps and protrudes from the base.

The term "below" refers to downward extension and includes adjacent and non-adjacent elements as well as overlapping and non-overlapping elements. For instance, in the cavity-up position, the base extends below, is adjacent to and is overlapped by the bump and protrudes from the bump in the downward direction. Likewise, the bump extends below the substrate even though it is not adjacent to or overlapped by the substrate.

The "first vertical direction" and "second vertical direction" do not depend on the orientation of the semiconductor assembly (or the thermal board), as will be readily apparent to those skilled in the art. For instance, the bump extends vertically beyond the base in the first vertical direction and vertically beyond the flange in the second vertical direction regardless of whether the assembly is inverted and/or mounted on a heat sink. Likewise, the flange extends "laterally" from the bump in a lateral plane regardless of whether the assembly is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the upward direction and the second vertical direction is the downward direction in the cavity-up position, and the first vertical direction is the downward direction and the second vertical direction is the upward direction in the cavity-down position.

The semiconductor assembly of the present invention has numerous advantages. The assembly is reliable, inexpensive and well-suited for high volume manufacture. The assembly is especially well-suited for high power semiconductor devices and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a thermally enhanced semiconductor assembly, comprising:
providing a bump, a flange, an adhesive and a conductive layer with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then
attaching the flange and the bump to the conductive layer via the adhesive between the flange and the conductive layer and between the bump and the conductive layer, including aligning the bump with the aperture; then
mounting a semiconductor device that includes a contact pad on the bump at the cavity; and
providing a build-up circuitry and a base, wherein the build-up circuitry extends from the semiconductor device and the flange in the first vertical direction and is electrically connected to the semiconductor device and the base covers the bump in the second vertical direction, is adjacent to the bump, extends laterally from the bump and includes a portion of the conductive layer that is adjacent to the aperture and spaced from the bump.

2. The method of claim 1, wherein providing the bump includes mechanically stamping a metal plate.

3. The method of claim 1, wherein attaching the flange and the bump to the conductive layer includes:

mounting the adhesive that is non-solidified on the flange, including aligning the bump with an opening of the adhesive;

mounting the conductive layer on the adhesive, including aligning the bump with the aperture of the conductive layer, wherein the adhesive is sandwiched between the flange and the conductive layer; then flowing the adhesive into a gap located in the aperture between the bump and the conductive layer; and solidifying the adhesive.

4. The method of claim 3, wherein:

flowing the adhesive into the gap includes applying heat to melt the adhesive, and moving the flange and the conductive layer towards one another, thereby moving the bump in the second vertical direction in the aperture and applying pressure to the molten adhesive between the flange and the conductive layer, wherein the pressure forces the molten adhesive to flow in the second vertical direction into the gap located in the aperture between the bump and the conductive layer; and solidifying the adhesive includes applying heat to solidify the molten adhesive, thereby mechanically attaching the bump and the flange to the conductive layer.

5. The method of claim 3, wherein:

providing the adhesive includes providing a prepreg with uncured epoxy;

flowing the adhesive includes melting the uncured epoxy and compressing the uncured epoxy between the flange and the conductive layer; and solidifying the adhesive includes curing the uncured epoxy.

6. The method of claim 3, wherein flowing the adhesive includes filling the gap with the adhesive and forcing the adhesive beyond the bump and the conductive layer in the second vertical direction such that the adhesive contacts surfaces of the bump and the conductive layer that face in the second vertical direction.

7. The method of claim 3, wherein mounting the conductive layer includes mounting the conductive layer alone on the adhesive such that the conductive layer contacts the adhesive and the aperture extends through the conductive layer alone.

8. The method of claim 3, wherein mounting the conductive layer includes mounting a laminated structure that includes the conductive layer and a substrate on the adhesive such that the substrate contacts and is sandwiched between the conductive layer and the adhesive, the conductive layer is spaced from the adhesive and the aperture extends through the conductive layer and the substrate.

9. The method of claim 1, wherein providing the build-up circuitry includes:

providing a dielectric layer on the semiconductor device and the flange that extends from the semiconductor device and the flange in the first vertical direction and includes a via opening that is aligned with the contact pad; and providing a conductive trace on the dielectric layer that extends from the dielectric layer in the first vertical direction and extends laterally on the dielectric layer and extends through the via opening in the second vertical direction to the contact pad, thereby electrically connecting the semiconductor device to the conductive trace.

10. The method of claim 9, wherein providing the conductive trace includes depositing a plated layer on the dielectric layer that extends through the via opening to the contact pad and then removing selected portions of the plated layer using an etch mask that defines the conductive trace.

11. The method of claim 1, wherein providing the base includes:

grinding the bump, the adhesive and the conductive layer such that the bump, the adhesive and the conductive layer are laterally aligned with one another at a lateral surface that faces in the second vertical direction; and then depositing a plated layer on the bump, the adhesive and the conductive layer, wherein the plated layer covers the bump in the second vertical direction and extends laterally from the bump to the conductive layer.

12. The method of claim 9, wherein providing the conductive trace and the base includes simultaneously depositing a first plated layer on the dielectric layer and a second plated layer on the bump, the adhesive and the conductive layer.

13. The method of claim 9, wherein providing the dielectric layer, the conductive trace and the base includes:

grinding the bump, the adhesive and the conductive layer such that the bump, the adhesive and the conductive layer are laterally aligned with one another at a lateral surface that faces in the second vertical direction; then depositing the dielectric layer on the semiconductor device and the flange; then forming the via opening in the dielectric layer; then depositing a first plated layer on the dielectric layer, wherein the first plated layer extends through the via opening to the contact pad;

depositing a second plated layer on the bump, the adhesive and the conductive layer, wherein the second plated layer covers the bump in the second vertical direction; then;

forming an etch mask on the first plated layer that defines the conductive trace;

etching the first plated layer in a pattern defined by the etch mask; and then;

removing the etch mask.

14. A method of making a thermally enhanced semiconductor assembly, comprising:

providing a bump, a flange, an adhesive and a substrate with an aperture, wherein the bump defines a cavity that faces in a first vertical direction, covers the cavity in a second vertical direction opposite the first vertical direction, is adjacent to and integral with the flange and extends from the flange in the second vertical direction, and the flange extends laterally from the bump in lateral directions orthogonal to the vertical directions; then;

attaching the flange and the bump to the substrate via the adhesive between the flange and the substrate and between the bump and the substrate, including aligning the bump with the aperture; then;

mounting a semiconductor device that includes a contact pad on the bump at the cavity; and providing a build-up circuitry and a base, wherein the build-up circuitry extends from the semiconductor device and the flange in the first vertical direction and is electrically connected to the semiconductor device and the base covers the bump in the second vertical direction, is adjacent to the bump and extends laterally from the bump.

15. The method of claim 14, wherein providing the bump includes mechanically stamping a metal plate.

16. The method of claim 14, wherein attaching the flange and the bump to the substrate includes:

mounting the adhesive that is non-solidified on the flange, including aligning the bump with an opening of the adhesive;

mounting the substrate on the adhesive, including aligning the bump with the aperture of the substrate wherein the adhesive is sandwiched between the flange and the substrate; then;

flowing the adhesive into a gap located in the aperture between the bump and the substrate; and solidifying the adhesive.

17. The method of claim 16, wherein:

flowing the adhesive into the gap includes applying heat to melt the adhesive, and moving the flange and the substrate towards one another, thereby moving the bump in the second vertical direction in the aperture and applying pressure to the molten adhesive between the flange and the substrate, wherein the pressure forces the molten adhesive to flow in the second vertical direction into the gap located in the aperture between the bump and the substrate; and solidifying the adhesive includes applying heat to solidify the molten adhesive, thereby mechanically attaching the bump and the flange to the substrate.

18. The method of claim 16, wherein:

providing the adhesive includes providing a prepreg with uncured epoxy;

flowing the adhesive includes melting the uncured epoxy and compressing the uncured epoxy between the flange and the substrate; and solidifying the adhesive includes curing the uncured epoxy.

19. The method of claim 16, wherein mounting the substrate on the adhesive includes mounting a laminated structure that includes the substrate and a conductive layer on the adhesive such that the substrate contacts and is sandwiched between the conductive layer and the adhesive, the conductive layer is spaced from the adhesive, the aperture extends through the conductive layer and the substrate and the base includes a portion of the conductive layer.

20. The method of claim 19, wherein flowing the adhesive includes filling the gap with the adhesive and forcing the adhesive beyond the bump and the conductive layer in the second vertical direction such that the adhesive contacts surfaces of the bump and the conductive layer that face in the second vertical direction.

21. The method of claim 19, wherein providing the build-up circuitry includes:

providing a dielectric layer on the semiconductor device and the flange that extends from the semiconductor device and the flange in the first vertical direction and includes a via opening that is aligned with the contact pad; and providing a conductive trace on the dielectric layer that extends from the dielectric layer in the first vertical direction and extends laterally on the dielectric layer and extends through the via opening in the second vertical direction to the contact pad, thereby electrically connecting the semiconductor device to the conductive trace.

22. The method of claim 21, wherein providing the conductive trace includes depositing a plated layer on the dielectric layer that extends through the via opening to the contact pad and then removing selected portions of the plated layer using an etch mask that defines the conductive trace.

23. The method of claim 19, wherein providing the base includes:

grinding the bump, the adhesive and the conductive layer such that the bump, the adhesive and the conductive layer are laterally aligned with one another at a lateral surface that faces in the second vertical direction; and then depositing a plated layer on the bump, the adhesive and the conductive layer, wherein the plated layer covers the bump in the second vertical direction and extends laterally from the bump to the conductive layer.

24. The method of claim 21, wherein providing the conductive trace and the base includes simultaneously depositing a first plated layer on the dielectric layer and a second plated layer on the bump, the adhesive and the conductive layer.

25. The method of claim 21, wherein providing the dielectric layer, the conductive trace and the base includes:

grinding the bump, the adhesive and the conductive layer such that the bump, the adhesive and the conductive layer are laterally aligned with one another at a lateral surface that faces in the second vertical direction; then;

depositing the dielectric layer on the semiconductor device and the flange; then;

forming the via opening in the dielectric layer; then;

depositing a first plated layer on the dielectric layer, wherein the first plated layer extends through the via opening to the contact pad;

depositing a second plated layer on the bump, the adhesive and the conductive layer, wherein the second plated layer covers the bump in the second vertical direction; then;

forming an etch mask on the first plated layer that defines the conductive trace;

etching the first plated layer in a pattern defined by the etch mask; and then;

removing the etch mask.

26. A method of making a thermally enhanced semiconductor assembly, comprising:

providing a bump and a flange, wherein the bump defines a cavity that faces in a first vertical direction, is adjacent to and integral with the flange and extends vertically from the flange in a second vertical direction opposite the first vertical direction, the flange extends laterally from the bump in lateral directions orthogonal to the vertical directions and the cavity is covered by the bump in the second vertical direction;

providing an adhesive, wherein an opening extends through the adhesive;

providing a laminated structure that includes a conductive layer and a substrate, wherein an aperture extends through the laminated structure;

mounting the adhesive on the flange, including inserting the bump into the opening;

mounting the laminated structure on the adhesive, including inserting the bump into the aperture, wherein the substrate contacts and is sandwiched between the conductive layer and the adhesive, the conductive layer is spaced from the adhesive and the adhesive contacts and is sandwiched between the flange and the substrate and is non-solidified; then;

applying heat to melt the adhesive;

moving the flange and the laminated structure towards one another, thereby moving the bump in the second vertical direction in the aperture and applying pressure to the molten adhesive between the flange and the laminated structure, wherein the pressure forces the molten adhesive to flow in the second vertical direction into a gap located in the aperture between the bump and the laminated structure;

applying heat to solidify the molten adhesive, thereby mechanically attaching the bump and the flange to the conductive layer and the substrate; then;
grinding the bump, the adhesive and the conductive layer such that the bump, the adhesive and the conductive layer are laterally aligned with one another at a lateral surface that faces in the second vertical direction; then;
mounting a semiconductor device that includes a contact pad on the bump using a die attach, thereby mechanically attaching and thermally connecting the semiconductor device to the bump, wherein the semiconductor device extends into the cavity and the bump provides a recessed die paddle for the semiconductor device; then
depositing a dielectric layer on the semiconductor device and the flange that extends from the semiconductor device and the flange in the first vertical direction and extends into and fills the remaining space in the cavity; then;
forming a via opening that extends through the dielectric layer and is aligned with and exposes the contact pad; then;
depositing a first plated layer on the dielectric layer and removing selected portions of the first plated layer in a pattern defined by an etch mask, wherein a conductive trace includes a selected portion of the first plated layer that extends from the dielectric layer in the first vertical direction and extends laterally on the dielectric layer and extends through the via opening in the second vertical direction to the contact pad, thereby electrically connecting the semiconductor device to the conductive trace;
depositing a second plated layer on the bump, the adhesive and the conductive layer, wherein a base is adjacent to the bump, extends from and covers the bump in the second vertical direction, extends laterally from the bump, includes a portion of the conductive layer that is adjacent to the substrate and spaced from the bump and includes a portion of the second plated layer that is adjacent to the bump, the adhesive and the conductive layer and covers the bump in the second vertical direction; and
providing a heat spreader that includes the bump, the base and the flange, wherein the semiconductor device is thermally connected to the base by the bump.

27. The method of claim 26, wherein providing the bump includes mechanically stamping a metal plate, thereby forming the bump in the metal plate and the cavity in the bump, wherein the bump is a stamped portion of the metal plate and the flange is an unstamped portion of the metal plate.

28. The method of claim 26, wherein:
providing the adhesive includes providing a prepreg with uncured epoxy;
flowing the adhesive includes melting the uncured epoxy and compressing the uncured epoxy between the flange and the substrate; and
solidifying the adhesive includes curing the uncured epoxy.

29. The method of claim 26, wherein flowing the adhesive includes filling the gap with the adhesive and forcing the adhesive beyond the bump and the conductive layer in the second vertical direction such that the adhesive contacts surfaces of the bump and the conductive layer that face in the second vertical direction.

30. The method of claim 26, comprising simultaneously depositing plated layers using electroless plating and electrolytic plating.

31. The method of claim 26, comprising removing a selected portion of the flange that is spaced from the bump after solidifying the adhesive and before mounting the semiconductor device, and then depositing the dielectric layer on and in contact with the semiconductor device, the bump, the flange and the adhesive and spaced from the substrate by the adhesive.

32. The method of claim 26, comprising depositing the dielectric layer on and in contact with the semiconductor device, the bump and the flange and spaced from the adhesive by the flange.

33. The method of claim 26, comprising:
forming an additional via opening that extends through the dielectric layer and is aligned with and exposes the flange; and then;
providing the conductive trace with a selected portion of the first plated layer that extends through the additional via opening in the second vertical direction to the flange, thereby electrically connecting the flange to the conductive trace.

34. The method of claim 26, comprising:
forming an additional via opening that extends through the dielectric layer and is aligned with and exposes the flange; and then;
providing an additional conductive trace that includes a selected portion of the first plated layer that extends from the dielectric layer in the first vertical direction and extends laterally on the dielectric layer and extends through the additional via opening in the second vertical direction to the flange, thereby electrically connecting the flange to the additional conductive trace.

35. The method of claim 26, comprising:
depositing a second dielectric layer on the dielectric layer and the conductive trace that extends from the dielectric layer and the conductive trace in the first vertical direction and is spaced from the semiconductor device, the flange and the cavity; then;
forming a second via opening that extends through the second dielectric layer and is aligned with and exposes the conductive trace; and then;
forming a second conductive trace that extends from the second dielectric layer in the first vertical direction and extends laterally on the second dielectric layer and extends through the second via opening in the second vertical direction to the conductive trace, thereby electrically connecting the conductive trace to the second conductive trace.

* * * * *